(12) United States Patent
Hayashi

(10) Patent No.: US 8,722,308 B2
(45) Date of Patent: *May 13, 2014

(54) ALUMINUM SUBSTRATES AND LITHOGRAPHIC PRINTING PLATE PRECURSORS

(75) Inventor: Koji Hayashi, Tatebayashi (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/221,936

(22) Filed: Aug. 31, 2011

(65) Prior Publication Data

US 2013/0052582 A1    Feb. 28, 2013

(51) Int. Cl.
   B41M 5/00      (2006.01)
   B41N 1/00      (2006.01)
   G03F 7/00      (2006.01)
   G03F 7/26      (2006.01)

(52) U.S. Cl.
   USPC ............... 430/270.1; 430/270.2; 430/275.1; 430/278.1; 430/281.1; 430/302; 101/453

(58) Field of Classification Search
   USPC ............. 430/270.1, 306; 101/453, 463.1
   See application file for complete search history.

(56) References Cited

U.S. PATENT DOCUMENTS

| | | | |
|---|---|---|---|
| 5,076,899 A | 12/1991 | Sakaki et al. | |
| 5,518,589 A | 5/1996 | Matsuura et al. | |
| 6,582,882 B2 | 6/2003 | Pappas et al. | |
| 6,899,994 B2 | 5/2005 | Huang et al. | |
| 7,005,234 B2 | 2/2006 | Hoshi et al. | |
| 7,078,153 B2 | 7/2006 | Hotta | |
| 7,261,998 B2 | 8/2007 | Hayashi et al. | |
| 7,368,215 B2 | 5/2008 | Munnelly et al. | |
| 7,883,830 B2 | 2/2011 | Hayashi et al. | |
| 2002/0033108 A1* | 3/2002 | Akiyama et al. | 101/457 |
| 2003/0221572 A1* | 12/2003 | Matsuura et al. | 101/463.1 |
| 2005/0003285 A1 | 1/2005 | Hayashi et al. | |
| 2007/0218404 A1* | 9/2007 | Watanabe | 430/270.1 |
| 2008/0003411 A1 | 1/2008 | Hunter et al. | |
| 2009/0092923 A1 | 4/2009 | Hayashi | |

FOREIGN PATENT DOCUMENTS

| | | |
|---|---|---|
| EP | 1 142 707 | 10/2011 |
| EP | 2 383 125 | 11/2011 |
| JP | 50133003 | 10/1975 |
| JP | 50138903 | 11/1975 |
| JP | 51100805 | 9/1976 |
| JP | 11-65096 | 3/1999 |
| JP | 2000-75504 | 3/2000 |
| JP | 2001322365 | 11/2001 |
| JP | 2005-053070 | 3/2005 |
| JP | 2005-271414 | 10/2005 |
| WO | 03/087939 | 10/2003 |

OTHER PUBLICATIONS

U.S. Appl. No. 13/221,940, filed Aug. 31, 2011, entitled "Lithographic Printing Plate Precursors For On-Press Development" by K. Hayashi.

* cited by examiner

Primary Examiner — Chanceity Robinson
(74) Attorney, Agent, or Firm — J. Lanny Tucker

(57) ABSTRACT

An aluminum-containing substrate can be provided for use in lithographic printing plate precursors. Before radiation-sensitive layers are applied, a grained and sulfuric acid anodized aluminum-containing support is treated with an alkaline or acidic pore-widening solution to provide its outer surface with columnar pores. The diameter of the columnar pores at their outermost surface is at least 90% of the average diameter of the columnar pores. Directly on this treated surface, a hydrophilic layer is applied, which hydrophilic layer contains a non-crosslinked hydrophilic polymer having carboxylic acid side chains.

13 Claims, No Drawings

ALUMINUM SUBSTRATES AND LITHOGRAPHIC PRINTING PLATE PRECURSORS

RELATED APPLICATION

Reference is made to copending and commonly assigned U.S. Ser. No. 13/221,940, filed on Aug. 31, 2011 (now published as 2013/0052589), by Hayashi.

FIELD OF THE INVENTION

This invention relates to the preparation of unique aluminum substrates and lithographic printing plate precursors containing the substrates. This invention also relates to methods for making the substrates and precursors, and to methods for using them to prepare lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise one or more imageable layers applied over the hydrophilic surface of a substrate. The imageable layers include one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The imageable elements for the preparation of lithographic printing plates have been designed to be sensitive to heat or infrared radiation and can be exposed using thermal heads of more usually, infrared laser diodes that image in response to signals from a digital copy of the image in a computer a platesetter. This "computer-to-plate" technology has generally replaced the former technology where masking films were used to image the elements.

These imaging techniques require the use of alkaline developers to remove exposed (positive-working) or non-exposed (negative-working) regions of the imaged layer(s). In some instances of positive-working lithographic printing plate precursors that are designed for IR imaging, compositions comprising infrared radiation-sensitive absorbing compounds (such as IR dyes) inhibits and other dissolution inhibitors make the coating insoluble in alkaline developers and soluble only in the IR-exposed regions.

Independently of the type of lithographic printing plate, lithography has generally been carried out using a metal substrate such as a substrate comprising aluminum or an aluminum alloy of various metallic compositions. The surface of the metal sheet is generally roughened by surface graining in order to ensure good adhesion to a layer, usually an imageable layer, that is disposed thereon and to improve water retention in non-imaged regions during printing. Such aluminum-supported imageable elements are sometimes known in the art as precursors to planographic printing plates or lithographic printing plates.

Various aluminum support materials and methods of preparing them are described in U.S. Pat. No. 5,076,899 (Sakaki et al.) and U.S. Pat. No. 5,518,589 (Matsura et al.).

In general, to prepare aluminum-containing substrates for lithographic printing plate precursors, a continuous web of raw aluminum is generally taken from unwind section through a degreasing section to remove oils and debris from the aluminum web, alkali etching section, a first rinsing section, a graining section that can include mechanical or electrochemical graining, or both, a second rinsing section, post-graining acidic or alkali-etching section, a third rinsing section, an anodization section using a suitable acid (such as sulfuric acid) to provide an anodic oxide coating, a fourth rinsing section, a "post-treatment" section, a final or fifth rinsing section, and a drying section, before either being rewound or passed on to coating stations for application of imageable layer formulations.

In the anodization section, the aluminum web is treated to form an aluminum oxide layer on its surface so it will exhibit a high degree of mechanical abrasion resistance necessary during the printing process. This aluminum oxide layer is already hydrophilic to some degree, which is significant for having a high affinity for water and for repelling printing ink. However, the oxide layer is so reactive that is can interact with components of the imageable layer in the imageable element. The aluminum oxide layer can partially or completely cover the aluminum substrate surface.

When sulfuric acid is used for providing the aluminum oxide layer, the resulting substrate can exhibit poorer adhesion to overlying radiation-sensitive compositions than if the substrate had been anodized using phosphoric acid. It is believed that the difference in adhesion can be caused by different anodic pore sizes created from the different acids used in anodization. That is, sulfuric acid anodization may produce smaller pores in the oxide layer.

Japanese Published Application 11-65096 (Fujifilm) describes a method for providing photosensitive lithographic printing plate precursors in which an anodic oxide layer is formed on the aluminum support, which anodic oxide pores have a diameter of 20 nm or less. A negative-working photosensitive layer is directly applied to this oxide layer.

U.S. Patent Application Publication 2002/0033108 (Akiyama et al.) describes the formation of oxide layers on aluminum supports to control the average size of the oxide pores in the range of from 6 nm to 40 nm. A water-receptive subbing layer can be applied over the oxide layer.

U.S. Pat. No. 7,078,153 (Hotta) describes a support having a predetermined vacancy ratio and micropores (vacancies) in its oxide surface.

After anodization, the substrate is typically "post-treated" with a suitable polymer to permanently seal the oxide pores so that components in the radiation-sensitive imageable layer do not enter the pores, and to further improve the hydrophilicity of the substrate surface so it better repels lithographic ink during the printing operation.

Commonly used post-treatment processes can include the reaction aluminum oxide with poly(vinyl phosphoric acid), or a mixture of sodium phosphate and sodium fluoride, to form a crosslinked hydrophilic layer on the substrate. To determine if pore sealing has occurred, the substrate can be dipped in an aqueous dye solution and rinsed. If little dye is seen on the substrate, the pores have been properly sealed.

It would be desirable to omit this post-treatment step of a sulfuric acid anodized aluminum-containing substrate that must be evaluated with an aqueous dye solution.

It is highly important to have good adhesion of the radiation-sensitive imageable layer to the underlying substrate. But it is also necessary to have rapid and complete removal of the exposed (positive-working) and non-exposed (negative-working) regions during development. These two important requirements often work against each other. It is very difficult to satisfy both requirements, especially when development is carrier out on-press where good adhesion of the remaining imaging layer is needed for it to survive thousands of printing impressions and complete removal of imageable layer should be accomplished within 50 printing impressions.

There is a need to improve both of these requirements especially when the sulfuric acid anodized substrates are used for the lithographic printing plate precursors that are on-press developable.

SUMMARY OF THE INVENTION

The present invention provides a substrate comprising a grained and sulfuric acid anodized aluminum-containing support, which support has also been treated with an alkaline or acidic pore-widening solution to provide its outer surface with columnar pores so that the diameter of the columnar pores at their outermost surface is at least 90% of the average diameter of the columnar pores, the substrate further comprising a hydrophilic layer disposed directly on the grained, sulfuric acid anodized and treated aluminum-containing support, the hydrophilic layer comprising a non-crosslinked hydrophilic polymer having carboxylic acid side chains.

This invention also provides a lithographic printing plate precursor comprising a substrate of this invention and at least one radiation-sensitive imageable layer disposed over the substrate, the radiation-sensitive imageable layer comprising a radiation absorber, the substrate comprising a grained and sulfuric acid anodized aluminum-containing support, which support has also been treated with an alkaline or acidic pore-widening solution to provide its outer surface with columnar pores so that the diameter of the columnar pores at their outermost surface is at least 90% of the average diameter of the columnar pores, the substrate further comprising a hydrophilic layer disposed directly on the grained, sulfuric acid anodized and treated aluminum-containing support, the hydrophilic layer comprising a non-crosslinked hydrophilic polymer having carboxylic acid side chains.

In addition, the present invention provides a method of preparing a lithographic printing plate comprising:

imagewise exposing the lithographic printing plate precursor of the present invention (for example, as described above) to provide an exposed precursor having exposed and non-exposed regions in the radiation-sensitive imageable layer, and processing the exposed precursor to remove either the non-exposed regions or the exposed regions to provide a lithographic printing plate.

For example, the lithographic printing plate precursor used in this method can be a positive-working lithographic printing plate precursor, and processing the exposed precursor can be carried out off-press to remove the exposed regions to provide a lithographic printing plate using an alkaline processing solution.

Alternatively, the lithographic printing plate precursor used in this method is a negative-working lithographic printing plate precursor, and processing of the exposed precursor is carried out off-press using water or an alkaline processing solution to remove the non-exposed regions to provide a lithographic printing plate.

Further, a lithographic printing plate can be obtained by the method of this invention (for example, as described above) wherein the lithographic printing plate comprises a substrate having thereon either exposed portions or non-exposed portions of a radiation-sensitive imageable layer, the substrate comprising a grained and sulfuric acid anodized aluminum-containing support, which support has also been treated with an alkaline or acidic pore-widening solution to provide its outer surface with columnar pores so that the diameter of the columnar pores at their outermost surface is at least 90% of the average diameter of the columnar pores, the substrate further comprising a hydrophilic layer disposed directly on the grained, sulfuric acid anodized, and treated aluminum-containing support, the non-radiation sensitive hydrophilic layer comprising a non-crosslinked hydrophilic polymer having carboxylic acid side chains, the non-crosslinked hydrophilic polymer being present at a dry coverage of at least 0.001 $g/m^2$ and up to and including 0.4 $g/m^2$.

Further, this invention provides a method for preparing an aluminum-containing article, comprising:

treating a grained and sulfuric acid anodized aluminum-containing support with an alkaline or acidic pore-widening solution to provide columnar pores in the outer surface so that the diameter of the columnar pores at their outermost surface is at least 90% of the average diameter of the columnar pores, to provide a substrate, and forming a hydrophilic layer directly on the substrate, the hydrophilic layer comprising a non-crosslinked hydrophilic polymer having carboxylic acid side chains, the non-crosslinked hydrophilic polymer being applied to a dry coverage of at least 0.001 $g/m^2$ and up to and including 0.4 $g/m^2$.

This invention provides a number of advantages. The lithographic printing plate precursors are prepared using grained and sulfuric acid anodized aluminum-containing substrate instead of the more costly phosphoric acid anodization. Adhesion of the radiation sensitive imageable layer to the sulfuric acid anodized substrate is improved, especially for on-press development so that thousands of impressions can be printed. However, the appropriate portions of the radiation sensitive imageable layer are quickly removed during development, for example within a few printed impressions during on-press development. Thus, quick removal of imageable layer during development is possible along with on-press printing durability. In addition, the present invention avoids the need for the typical post-treatment process in order to seal oxide pores, either before or after the pore widening operation.

These advantages have been achieved in the practice of this invention by the pore widening operation described herein whereby the oxide pores are widened before application of a radiation sensitive imageable layer formulation. After pore widening, the substrate is coated with a relatively thin hydrophilic layer (that can be non-radiation sensitive) comprising a particular type of polymer having carboxylic acid side chains.

DETAILED DESCRIPTION OF THE INVENTION

Definitions

Unless the context indicates otherwise, when used herein, the terms "substrate", "lithographic printing plate precursor", "positive-working lithographic printing plate precursor", and "negative-working lithographic printing plate precursor" are meant to be references to embodiments of the present invention.

The term "support" is used herein to refer to an aluminum-containing material (web, sheet, foil, or other form) that is then treated to prepare a "substrate" that refers to the hydrophilic article upon which various layers are coated.

The term "post-treatment" refers to treating the grained and anodized aluminum-containing support with an aqueous solution to coat it with an interlayer on the anodized substrate. Such a "post-treatment" is not used in the practice of the present invention between the process of pore widening and the application of the hydrophilic layer.

In addition, unless the context indicates otherwise, the various components described herein such as the components of the various layers in the imageable elements or of the pore-widening solutions used in the method of this invention, refer to one or more of those components. Thus, the singular form "a", "an", or "the" is not necessarily meant to refer to only a single component but can also include the plural referents.

Terms that are not explicitly defined in the present application are to be understood to have meaning that is commonly accepted by those skilled in the art. If the construction of a term would render it meaningless or essentially meaningless in this context, the term's definition should be taken from a standard dictionary.

Unless otherwise indicated, percentages refer to percents by dry weight of a composition or layer, or % solids of a solution.

As used herein, the term "radiation absorber" refers to compounds that are sensitive to certain wavelengths of radiation and can convert photons into heat within the layer in which they are disposed.

As used herein, the term "infrared" refers to radiation having a of at least 700 nm and higher. In most instances, the term "infrared" is used to refer to the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers that are derived from two or more different monomers, in random order along the polymer backbone. That is, they comprise recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The substrates of this invention can be used to prepare lithographic printing plate precursors as described in more detail below. The substrates can be used for any application requiring hydrophilic aluminum-containing surfaces.

Substrate

The substrates prepared according to this invention are generally provided initially as a grained and sulfuric acid anodized aluminum-containing support, that is, wherein aluminum as the predominant component. Thus, the grained and sulfuric acid anodized support can be composed of pure aluminum, aluminum alloys having small amounts (up to 10% by weight) of other elements such as manganese, silicon, iron, titanium, copper, magnesium, chromium, zinc, bismuth, nickel, or zirconium, or be polymeric films or papers on which a pure aluminum or aluminum alloy sheet is laminated or deposited (for example, a laminate of an aluminum sheet and a polyester film). Generally, the grained pure aluminum or aluminum alloys are used in this invention. The supports can be in any useful form or shape including continuous webs, sheets, and coils.

The thickness of the resulting substrate can be varied but should be sufficient to sustain the wear from printing and thin enough to wrap around a printing form. Generally, substrates have a thickness of at least 100 μm and up to and including 600 μm.

In general, the supports used to prepare the substrates have the desired tensile strength, elasticity, crystallinity, conductivity, and other physical properties that are conventional in the lithographic art, which properties can be achieved using known treatments such as heat treatment, cold or hot fabrication processes, or other methods conventional in the art of aluminum alloy fabrication for lithographic substrate preparation.

The substrates can be prepared as continuous webs or coiled strips that can be cut into desired sheets at a later time.

The aluminum-containing surface of the support is generally cleaned, grained (for example electrochemically grained), and sulfuric acid anodized using suitable known procedures before the pore-widening treatment and application of hydrophilic layer according to this invention. For example, a degreasing treatment with a surfactant, an organic solvent, or an alkaline water solution is typically used to remove oil and grease from the surface of the aluminum-containing support. Then, the surface can be roughened (or grained) using well known techniques, such as mechanical roughening, electrochemical roughening, or a combination thereof (multi-graining). Electrochemically graining can be carried out in a suitable manner as described for example in U.S. Pat. No. 7,049,048 (Hunter et al.).

In some embodiments, the surface of the aluminum-containing support can be electrochemically grained using the procedure and chemistry described in U.S. Patent Application Publication 2008/0003411 (Hunter et al.). In these procedures, the roughened aluminum-containing support is subjected to alternating current preferably in an electrolytic solution containing a suitable strong acid such as hydrochloric, nitric acid, or mixtures thereof. The alternating current used in the graining process can have any desired wave form that alternates between positive and negative voltages including but not limited to, a square wave, trapezoidal wave, or sine wave. Such graining is carried out at a current density of at least 50 $A/dm^2$ and up to and including 200 $A/dm^2$.

This electrochemically grained support can then be etched to remove at least 100 mg of aluminum per m². Etching can be carried out by immersing the metal sheet in a highly acidic solution or a highly alkaline solution having a pH of at least 13 and a conductivity of from about 30 mS/cm to about 90 mS/cm. It is desired to remove sufficient aluminum metal in order to change its optical density, which is directly related to the "smut" level on the surface of the aluminum sheet.

Such an electrochemically grained aluminum support can then be anodized in an alternating current passing through a sulfuric acid solution (5-30%) at a temperature of at least 20° C. and up to and including 60° C. for at least 5 seconds and up to and including 250 seconds to form an oxide layer on the metal surface. Phosphoric acid is not used for anodization in the practice of this invention. Generally, sulfuric acid anodization is carried out to provide an aluminum oxide layer of at least 0.3 g/m² and typically at least 1 g/m² and up to and including 10 g/m², or up to and including 5 g/m². The conditions for sulfuric acid anodization are generally well known in the art, for example in U.S. Pat. No. 7,078,153 (Hotta) that is incorporated herein by reference.

This anodization treatment produces pores in the aluminum oxide layer. The vacancy of the aluminum oxide layer can vary from at least 20% and up to and including 70%, as defined by the equation:

$$\text{vacancy} = (1-(\text{density of oxide coating}/3.98)) \times 100$$

The formed aluminum oxide layer generally has fine concave parts that are sometimes referred as "micropores" or "pores" that are distributed, perhaps uniformly, over the layer surface. The density (or vacancy) is generally controlled by properly selecting the conditions of the sulfuric acid anodization treatment. The pores can appear as columns within the aluminum oxide layer, as viewed in a cross-sectional microimage. These columnar pores can have an average diameter of less than 20 nm before they are treated to widen the average diameter at the outermost surface, or most of the columnar pores have an average diameter of at least 5 nm and up to and including 20 nm before they are treated.

According to this invention, the electrochemically grained and sulfuric acid anodized aluminum-containing support is then treated to widen the pores in the aluminum oxide layer ("pore-widening treatment") so that the diameter of the columnar pores at their outermost surface (that is, nearest the outermost layer surface) is at least 90%, and more typically at least 92%, and even more than 100% of the average diameter of the columnar pores. The average diameter of the columnar pores can be measured using a field emission scanning electron microscope. Once this average diameter is determined, it is possible to determine whether the diameter at the outermost surface is at least 90% of that average diameter value using similar measuring techniques. Thus, while the process described in U.S. Patent Application Publication 2002/0033108 (noted above) controls the average pore diameter, it fails to provide a process for controlling the pore diameter at the outermost pore surface so that it is at least 90% of the average pore diameter. Moreover, the pores are sealed according to the teaching in this publication using known methods including the use of an alkali metal silicate.

The columnar pores are widened using an alkaline or acidic pore-widening solution to remove at least 10 weight % and up to and including 80 weight %, typically at least 10 weight % and up to and including 60 weight %, or more likely at least 20 weight % and up to and including 50 weight %, of the original aluminum oxide layer. Pore widening can thus be accomplished using an alkaline solution containing sodium hydroxide, potassium hydroxide, lithium hydroxide, or mixtures of hydroxides, having a pH of at least 11 and up to and including 13, or more likely having a pH of at least 11.5 and up to and including 12.5, and a hydroxide (such as a sodium hydroxide) concentration of at least 0.15 g/l and up to and including 1.5 g/l. The alkaline or acidic pore-widening solution generally has conductivity of at least 0.8 mS/cm and up to and including 8.2 mS/cm.

Alternatively, an acidic solution containing an inorganic acid such as sulfuric acid, phosphoric acid, hydrochloric acid, nitric acid, or mixtures of these acids at a concentration of at least 10 g/l and up to and including 500 g/l or more likely of at least 20 g/l and up to and including 100 g/l.

Particularly useful pore-widening solutions comprise sodium hydroxide, potassium hydroxide, sulfuric acid, hydrochloric acid, nitric acid, or phosphoric acid.

The pore-widening treatment with the acidic or alkaline solution can be carried out by contacting the electrochemically grained and sulfuric acid anodized support, for example by immersion in the solution, for at least 3 seconds and up to and including 300 seconds, and typically for at least 10 seconds and up to and including 120 seconds to provide columnar pores having an average diameter of at least 20 nm and up to and including 40 nm. The treatment temperature is at least 0° C. and up to and including 110° C. or typically a treatment temperature of at least 20° C. and up to and including 70° C.

Once the electrochemically grained and sulfuric acid anodized aluminum-containing support has been treated with the pore-widening solution, a hydrophilic layer is formed over the resulting substrate using a hydrophilic layer formulation that can contain appropriate coating solvents. The method of this invention does not include the known post-treatment processes using coatings of poly(vinyl phosphonic acid) or vinyl phosphonic acid copolymers, silicates, dextrin, calcium zirconium fluoride, or hexafluorosilicic acid, or treatments with a phosphate solution that also contains an inorganic fluoride (PF).

Rather, the hydrophilic layer applied to the substrate of this invention comprises one or more linear or branched, non-crosslinked hydrophilic polymers, each polymer having carboxylic acid side chains (pendant groups). In the present invention, these non-crosslinked hydrophilic polymers are generally the only polymers present in this hydrophilic layer, and they can be applied in an amount to provide a dry coverage of at least 0.001 g/m² and up to and including 0.4 g/m², or more typically of at least 0.01 g/m² and up to and including 0.3 g/m². The acidic side chains on the non-crosslinked hydrophilic polymer can be neutralized, or at least some of the side chains are neutralized ("partially neutralized"). In general, the non-crosslinked hydrophilic polymer has carboxylic acid side chains that are neutralized to a degree of at least 1 mol % and up to and including 60 mol %, based on the total moles of carboxylic acid side chains. More typically, the partial neutralization of the side chains is at least 10 mol % and up to and including 50 mol %. Neutralization can be achieved by treating the polymer using a hydroxide or amine such as an alkaline metal hydroxide, alkaline earth metal hydroxide, an inorganic amine, or an organic amine, and known reaction conditions. In most embodiments, the hydrophilic layer is non-radiation sensitive, meaning that it is not intentionally designed to absorb an amount of radiation of any wavelength so as to affect imaging or development effects in the practice of this invention.

One or more non-crosslinked hydrophilic polymers are present in the hydrophilic layer in an amount of at least 50 weight % and up to and including 100 weight %, or typically at least 70 weight % and up to and including 100 weight %, based on the total solids of the hydrophilic layer.

The hydrophilic layer provided on the substrate is a "releasable layer", meaning that at least 80 weight % (or typically at least 90 weight %) of the hydrophilic layer is removable after 150 impressions, or more likely after 500 impressions, using the following print test:

Test: Contacting the dry coated hydrophilic layer (0.22 g/m²) with Fusion® G Magenta lithographic printing ink (DIC of Tokyo, Japan) and a mixture of NA108W fountain solution (1 weight %, DIC of Tokyo, Japan) and isopropyl alcohol (1 weight %) as a fountain solution on a Roland-200® printing (Man-Roland, Germany) for at least 150 impressions.

Representative non-crosslinked hydrophilic polymers useful in the practice of this invention include but are not limited to, homopolymers and copolymers comprising recurring units having at least partially neutralized carboxylic acid side chains. Such recurring units can be derived from ethylenically unsaturated polymerizable monomers such as (meth)acrylic acid, itaconic acid, maleic anhydride, maleic acid, (meth)acrylates having carboxy groups in the molecule, and others that would be readily apparent to one skilled in the art. Alternatively, a polymer containing alkyl ester side groups can be formed, and these alkyl ester side groups can be reacted with an alkaline compound to form carboxylic acid groups that can then be at least partially neutralized.

The non-crosslinked hydrophilic polymer can also have other recurring units that do not contain carboxylic acid side groups, which recurring units can be derived from one or more of poly(oxyethylene) (meth)acrylates, (meth)acrylamides, 2-(meth)acrylamido 2-methyl propanesulfonic acid and its salts, poly(oxyethylene) alkyl ether (meth)acrylate, vinyl phosphonic acid and its salts, acid phosphoxy ethyl (meth)acrylate and its salts, acid phosphoxy propyl (meth)acrylate and its salts, acid phosphoxy polyoxyethylene glycol (meth)acrylate and its salts, acid phosphoxy polyoxypropylene glycol (meth)acrylate and its salts, vinyl alcohol, vinyl pyrrolidone, vinyl imidazole, hydroxy ethyl (meth)acrylate, carboxylic acid ethyl (meth)acrylate, vinyl imidazole, vinyl caprolactam, and (3-acrylamidopropyl)trimethylammonium chloride.

The non-crosslinked hydrophilic polymers can also have recurring units comprising ethylenically unsaturated double bonds in side chains as long as such bonds are at levels that do not contribute to significant crosslinking. Monomers that can be used to provide recurring units with such side chains are described for example in Japanese Published Applications JP 2001-312068 and JP 2005-14294.

The non-crosslinked hydrophilic copolymers useful in the present invention can be derived from two or more ethylenically unsaturated polymerizable monomers that are polymerized using known reaction conditions to provide the recurring units along the polymer chains in random order.

In such non-crosslinked hydrophilic copolymers, the recurring units having carboxylic acid side groups (or neutralized carboxylic acid side groups) can comprise at least 1 mol % and up to and including 50 mol % of all recurring units, or typically at least 1 mol % and up to and including 30 mol % of all recurring units.

The hydrophilic polymers useful in this invention are non-crosslinked, meaning that crosslinked bonds or crosslinkable groups are not purposely introduced into the polymer chain or side groups. The non-crosslinked hydrophilic polymers generally have a weight average molecular weight of at least 1,000 and up to and including 200,000 as determined by Gel Permeation Chromatography. They also generally have a glass transition temperature of at least 50° C. and up to and including 350° C. as measured using standard differential scanning calorimetry.

The hydrophilic layer can also comprise one or more inorganic phosphoric acids or inorganic phosphoric acid precursors. These compounds can be present in the hydrophilic layer in an amount of at least 0.1 weight % and up to and including 4 weight %, and typically in an amount of at least 0.3 weight % and up to and including 3 weight %, based on the non-crosslinked hydrophilic layer total solids. The term "inorganic phosphoric acid" is meant to include what is known as orthophosphoric acid ($H_3PO_4$) as well as inorganic polyphosphoric acids having the formula $HO-(PO_2OH)_xH$ wherein x is the number of phosphoric acid units in the molecule. Such compounds can be an inorganic phosphoric acid precursor that forms orthophosphoric acid upon hydrolysis. Other useful inorganic phosphoric acid precursors include pyrophosphoric acid, metaphosphoric acid, and phosphoric anhydride.

The hydrophilic layer can be applied to and directly disposed on the aluminum-containing substrate using various techniques including coating of the hydrophilic layer formulation by gravure roll coating, reverse roll coating, slot die coating, or spraying, or the substrate can be immersed in the hydrophilic layer formulation for a suitable time. Solvents for the hydrophilic layer formulation include but are not limited to, water, water-miscible alcohols, acetone, water-miscible ethers, and mixtures thereof. Water is the most useful solvent for the hydrophilic layer formulation.

In some embodiments, the hydrophilic layer formulation consists essentially of one or more non-crosslinked hydrophilic polymers and one or more inorganic phosphoric acids or inorganic phosphoric acid precursors. This means that the no other components are essential to the hydrophilic polymer formulation. However, in other embodiments, optional additives of the hydrophilic formulation, and the resulting hydrophilic layer can include one or more surfactants. In still other embodiments, the hydrophilic layer formulation consists essentially of the one or more non-crosslinked hydrophilic polymers and optionally one or more surfactants. As noted below, a positive-working or negative-working radiation-sensitive imageable layer can be formed directly on the hydrophilic layer.

The backside (non-imaging side) of the substrate of this invention can be coated with antistatic agents or slipping layers or a matte layer to improve handling and "feel" of the imageable element.

Negative-Working Lithographic Printing Plate Precursors

Some embodiments of this invention can be formed by suitable application of a negative-working radiation-sensitive composition as described below to a substrate of this invention to form a negative-working radiation sensitive imageable layer comprising a free radically polymerizable compound, a radiation absorber (such as an infrared radiation absorber), and a compound to generate free radicals upon irradiation. There is generally only a single imageable layer comprising the radiation-sensitive composition and it can be the outermost layer in the element. However, a topcoat can be present over the imageable layers that are designed for off-press development.

Negative-working lithographic printing plate precursors are described for example, in EP Patent Publications 770, 494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Shrehmel et al.), and U.S. Pat. No. 7,672,241 (Munnelly et al.), and U.S. Patent Application Publications 2003/0064318 (Huang et al.), 2004/0265736 (Aoshima et al.), 2005/0266349 (Van Damme et al.), and 2006/0019200 (Vermeersch et al.), all of which are incorporated herein by reference. Other negative-working compositions and elements are described for example in U.S. Pat. No. 6,232,038 (Takasaki), U.S. Pat. No. 6,627,380 (Saito et al.), U.S. Pat. No. 6,514,657 (Sakurai et al.), U.S. Pat. No. 6,808,857 (Miyamoto et al.), and U.S. Patent Publication 2009/0092923 (Hayashi), all of which are incorporated herein by reference. The radiation-sensitive compositions and imageable layers used in such precursors can generally include one or more polymeric binders that facilitate the developability of the imaged precursors. Such polymeric binders include but are not limited to, those that are not generally crosslinkable and are usually film-forming in nature (dissolvable in coating solvent) but other polymeric binders can be present at least partially as discrete particles (not-agglomerated). Such polymers can be present as discrete particles having an average particle size of at least 10 and up to and including 500 nm, and typically at least 100 and up to and including 450 nm, and that are generally distributed uniformly within that layer. The particulate polymeric binders exist at room temperature as discrete particles, for example in an aqueous dispersion. Such polymeric binders generally have a molecular weight ($M_n$) of at least 5,000 and typically at least 20,000 and up to and including 100,000, or at least 30,000 and up to and including 80,000, as determined by Gel Permeation Chromatography.

For negative-working lithographic printing plate precursors that are designed for on-press development, useful particulate polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.), and US Patent Application Publication 2005/0003285 (Hayashi et al.), all of which are incorporated herein by reference. More specifically, such polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

Alternatively, the particulate polymeric binders can also have a backbone comprising multiple (at least two) urethane moieties. Such polymeric binders generally have a molecular weight ($M_n$) of at least 2,000 and typically at least 100,000 and up to and including 500,000, or at least 100,000 and up to and including 300,000, as determined by dynamic light scattering.

Additional useful polymeric binders are particulate poly (urethane-acrylic) hybrids that are distributed (usually uniformly) throughout the imageable layer. Each of these hybrids has a molecular weight of at least 50,000 and up to and including 500,000 and the particles have an average particle size of at least 10 and up to and including 10,000 nm (typically at least 30 and up to and including 500 nm or at least 30 and up to and including 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that can also include commercial surfactants, anti-foaming agents, dispersing agents, anti-corrosive agents, and optionally pigments and water-miscible organic solvents.

These polymeric binders are generally present in an amount of at least 5 and up to and including 70 weight % of the radiation-sensitive composition.

Other useful polymeric binders can be homogenous, that is, film-forming, non-particulate, or dissolvable in the coating solvent. Such polymeric binders include but are not limited to, (meth)acrylic acid and acid ester resins [such as (meth) acrylates], polyvinyl acetals, phenolic resins, polymers derived from styrene, N-substituted cyclic imides or maleic anhydrides, such as those described in EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), and U.S. Pat. No. 6,893,797 (Munnelly et al.), all of which are incorporated herein by reference. Also useful are the vinyl carbazole polymers described in U.S. Pat. No. 7,175,949 (Tao et al.), and the polymers having pendant vinyl groups as described in U.S. Pat. No. 7,279,255 (Tao et al.), both patents being incorporated herein by reference. Useful are random copolymers derived from polyethylene glycol methacrylate/acrylonitrile/styrene monomers in random fashion and in particulate form, dissolved random copolymers derived from carboxyphenyl methacrylamide/acrylonitrile/-methacrylamide/N-phenyl maleimide, random copolymers derived from polyethylene glycol methacrylate/acrylonitrile/vinyl carbazole/styrene/-methacrylic acid, random copolymers derived from N-phenyl maleimide/methacrylamide/methacrylic acid, random copolymers derived from urethane-acrylic intermediate A (the reaction product of p-toluene sulfonyl isocyanate and hydroxylethyl methacrylate)/acrylonitrile/N-phenyl maleimide, and random copolymers derived from N-methoxymethyl methacrylamide/methacrylic acid/acrylonitrile/n-phenylmaleimide. By "random" copolymers, we mean the conventional use of the term, that is, the structural units in the polymer backbone that are derived from the monomers are arranged in random order as opposed to being block copolymers, although two or more of the same structural units can be in a chain incidentally.

Thus, the polymeric binders can be selected from any alkaline solution soluble (or dispersible) polymer having an acid value of at least 20 and up to and including 400 (typically at least 30 and up to and including 200). The following described polymeric binders are particularly useful in the manner but this is not an exhaustive list:

I. Film-forming polymers formed by polymerization of a combination or mixture of (a) (meth)acrylonitrile, (b) poly(alkylene oxide) esters of (meth)acrylic acid, and optionally (c) (meth)acrylic acid, (meth)acrylate esters, styrene and its derivatives, and (meth)acrylamide as described for example in U.S. Pat. No. 7,326,521 (Tao et al.) that is incorporated herein by reference. Some particularly useful polymeric binders in this class are derived from one or more (meth)acrylic acids, (meth)acrylate esters, styrene and its derivatives, vinyl carbazoles, and poly(alkylene oxide) (meth)acrylates.

II. Film-forming polymers having pendant allyl ester groups as described in U.S. Pat. No. 7,332,253 (Tao et al.) that is incorporated herein by reference. Such polymers can also include pendant cyano groups or have recurring units derived from a variety of other monomers as described in Col. 8, line 31 to Col. 10, line 3 of the noted patent.

III. Film-forming polymers having all carbon backbones wherein at least 40 and up to and including 100 mol % (and typically at least 40 and up to and including 50 mol %) of the carbon atoms forming the all carbon backbones are tertiary carbon atoms, and the remaining carbon atoms in the all carbon backbone being non-tertiary carbon atoms. By "tertiary carbon", we refer to a carbon atom in the all carbon backbone that has three valences filled with radicals or atoms other than a hydrogen atom (which fills the fourth valence). By "non-tertiary carbon", we mean a carbon atom in the all carbon backbone that is a secondary carbon (having two valences filled with hydrogen atoms) or a quaternary carbon (having no hydrogen atoms attached). Typically, most of the non-tertiary carbon atoms are secondary carbon atoms. One way to represent a tertiary carbon atom in the all carbon backbone is with the following Structure (T-CARBON):

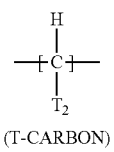

(T-CARBON)

wherein $T_2$ is a group other than hydrogen provided that $T_2$ does not include an ethylenically unsaturated free radically reactive group (such as a —C═C— group). In many embodiments, $T_2$ is a pendant group selected from N-carbazole, aryl (defined similarly as for Ar below), halo, cyano, —C(═O)Ar, —C(═O)OR, —C(═O)OAr, —C(═O)NHR, and —C(═O)NHAr pendant groups, wherein R is hydrogen or an alkyl, cycloalkyl, halo, alkoxy, acyl, or acyloxy group, and Ar is an aryl group other than a styryl group. The quaternary carbon atoms present in the all carbon backbone of the polymeric binder can also have the same or different pendant groups filling two of the valences. For example, one or both valences can be filled with the same or different alkyl groups as defined above for R, or one valence can be filled with an alkyl group and another valence can be filled with a N-carbazole, aryl other than a styryl group, halo, cyano, —C(═O)R, —C(═O)Ar, —C(═O)OR, —C(═O)OAr, —C(═O)NHR, or —C(═O)NHAr pendant group, wherein R and Ar are as defined above. The pendant groups attached to the tertiary and quaternary carbons in the all carbon backbone can be the same or different and typically, they are different. It should also be understood that the pendant groups attached to the various tertiary carbon atoms can be the same throughout the polymeric molecule, or they can be different. For example, the tertiary carbon atoms can be derived from the same or different ethylenically unsaturated polymerizable monomers. Moreover, the quaternary carbon atoms throughout the polymeric molecule can have the same or different pendant groups.

In some embodiments, the film-forming polymeric binder can be represented by the following Structure:

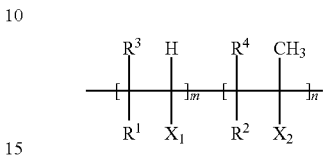

that is defined in more details in U.S. Patent Application Publication 2008-0280229 (Tao et al.) that is incorporated herein by reference.

Representative recurring units comprising tertiary carbon atoms can be derived from one or more ethylenically unsaturated polymerizable monomers selected from vinyl carbazole, styrene and derivatives thereof (other than divinylbenzene and similar monomers that provide pendant carbon-carbon polymerizable groups), acrylic acid, acrylonitrile, acrylamides, acrylates, and methyl vinyl ketone. As noted above, two or more different recurring units can be used. Similarly, representative recurring units with secondary or quaternary carbon atoms can be derived from one or more ethylenically unsaturated polymerizable monomers selected from methacrylic acid, methacrylates, methacrylamides, and α-methylstyrene.

IV. Film-forming, polymeric binders that have one or more ethylenically unsaturated pendant groups (reactive vinyl groups) attached to the polymer backbone. Such reactive groups are capable of undergoing polymerizable or crosslinking in the presence of free radicals. The pendant groups can be directly attached to the polymer backbone with a carbon-carbon direct bond, or through a linking group that is not particularly limited. The reactive vinyl groups can be substituted with at least one halogen atom, carboxy group, nitro group, cyano group, amide group, or alkyl, aryl, alkoxy, or aryloxy group, and particularly one or more alkyl groups. In some embodiments, the reactive vinyl group is attached to the polymer backbone through a phenylene group as described, for example, in U.S. Pat. No. 6,569,603 (Furukawa et al.) that is incorporated herein by reference. Other useful polymeric binders have vinyl groups in pendant groups that are described, for example in EP 1,182,033A1 (Fujimaki et al.) and U.S. Pat. No. 4,874,686 (Urabe et al.), U.S. Pat. No. 7,729,255 (Tao et al.), U.S. Pat. No. 6,916,595 (Fujimaki et al.), and U.S. Pat. No. 7,041,416 (Wakata et al.) that are incorporated by reference, especially with respect to the general formulae (1) through (3) noted in EP 1,182,033A1.

V. Film-forming polymeric binders can have pendant 1H-tetrazole groups as described in U.S. Patent Application Publication 2009-0142695 (Baumann et al.) that is incorporated herein by reference.

VI. Still other useful polymeric binders can be film-forming or exist as discrete particles and include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182,033 (noted above) and U.S. Pat. No. 6,309,792 (Hauck et al.), U.S. Pat. No. 6,352,812 (Shimazu et al.), U.S. Pat. No. 6,569,603 (noted above), and U.S. Pat. No. 6,893,797 (Munnelly et al.).

Also useful are the vinyl carbazole polymers described in U.S. Pat. No. 7,175,949 (Tao et al.). Other useful polymeric binders are particulate poly(urethane-acrylic) hybrids that are distributed (usually uniformly) throughout the imageable layer. Each of these hybrids has a molecular weight of at least 50,000 and up to and including 500,000 and the particles have an average particle size of at least 10 and up to and including 10,000 nm (typically at least 30 and up to and including 500 nm).

The radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable compounds include urea urethane (meth)acrylates or urethane (meth)acrylates having multiple polymerizable groups. For example, a free radically polymerizable component can be prepared by reacting DES-MODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Application Publication 2009/0142695 (Baumann et al.), which radically polymerizable components include 1H-tetrazole groups.

In addition to, or in place of the free radically polymerizable components described above, the radiation-sensitive composition can include polymeric materials that include side chains attached to the backbone, which side chains include one or more free radically polymerizable groups (such as ethylenically unsaturated groups) that can be polymerized (crosslinked) in response to free radicals produced by the initiator composition (described below). There can be at least two of these side chains per molecule. The free radically polymerizable groups (or ethylenically unsaturated groups) can be part of aliphatic or aromatic acrylate side chains attached to the polymeric backbone. Generally, there are at least 2 and up to and including 20 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

This radiation-sensitive composition also includes an initiator composition that includes one or more initiators that are capable of generating free radicals sufficient to initiate polymerization of all the various free radically polymerizable components upon exposure of the composition to imaging infrared radiation. The initiator composition is generally responsive, for example, to electromagnetic radiation in the infrared spectral regions, corresponding to the broad spectral range of at least 700 nm and up to and including 1400 nm, and typically radiation of at least 700 nm and up to and including 1250 nm. Alternatively, the initiator composition can be responsive to exposing radiation in the violet region of at least 250 and up to and including 450 nm and typically at least 300 and up to and including 450 nm.

More typically, the initiator composition includes one or more an electron acceptors and one or more co-initiators that are capable of donating electrons, hydrogen atoms, or a hydrocarbon radical.

In general, suitable initiator compositions for radiation-sensitive compositions comprise initiators that include but are not limited to, aromatic sulfonylhalides, trihalogenomethylsulfones, imides (such as N-benzoyloxyphthalimide), diazosulfonates, 9,10-dihydroanthracene derivatives, N-aryl, S-aryl, or O-aryl polycarboxylic acids with at least 2 carboxy groups of which at least one is bonded to the nitrogen, oxygen, or sulfur atom of the aryl moiety (such as aniline diatetic acid and derivatives thereof and other "co-initiators" described in U.S. Pat. No. 5,629,354 of West et al.), oxime ethers and oxime esters (such as those derived from benzoin), α-hydroxy or α-amino-acetophenones, trihalogenomethylarylsulfones, benzoin ethers and esters, peroxides (such as benzoyl peroxide), hydroperoxides (such as cumyl hydroperoxide), azo compounds (such as azo bis-isobutyronitrile), 2,4,5-triarylimidazolyl dimers (also known as hexaarylbiimidazoles, or "HABI's") as described for example in U.S. Pat. No. 4,565,769 (Dueber et al.), trihalomethyl substituted triazines, boron-containing compounds (such as tetraarylborates and alkyltriarylborates) and organoborate salts such as those described in U.S. Pat. No. 6,562,543 (Ogata et al.), and onium salts (such as ammonium salts, diaryliodonium salts, triarylsulfonium salts, aryldiazonium salts, and N-alkoxypyridinium salts).

Hexaarylbiimidazoles, onium compounds, and thiol compounds as well as mixtures of two or more thereof are desired co-initiators or free radical generators, and especially hexaarylbiimidazoles and mixtures thereof with thiol compounds are useful. Suitable hexaarylbiimidazoles are also described in U.S. Pat. No. 4,565,769 (Dueber et al.) and U.S. Pat. No. 3,445,232 (Shirey) and can be prepared according to known methods, such as the oxidative dimerization of triarylimidazoles.

Useful initiator compositions for IR radiation-sensitive compositions include onium compounds including ammonium, sulfonium, iodonium, and phosphonium compounds, particularly in combination with cyanine infrared radiation-sensitive dyes. Useful iodonium cations are well known in the art including but not limited to, U.S. Patent Application Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Thus, the iodonium cations can be supplied as part of one or more iodonium salts, and the iodonium cations can be supplied as iodonium borates also containing suitable boron-containing anions particularly in combination with cyanine infrared radiation-sensitive dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.) that is incorporated herein by reference.

Useful IR radiation-sensitive initiator compositions can comprise one or more diaryliodonium borate compounds. Representative iodonium borate compounds useful in this invention include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenypiodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexyl-phenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexyl-phenyliodonium tetrakis(penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis (4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition.

The imageable layers comprise a radiation-sensitive imaging composition that includes one or more infrared radiation absorbers or one or more UV sensitizers. The total amount of one or more infrared radiation absorbers or sensitizers is at least 1 and up to and including 30 weight %, or typically at least 5 and up to and including 20 weight %, based on the imageable layer total solids.

In some embodiments, the radiation-sensitive composition contains a UV sensitizer where the free-radical generating compound is UV radiation sensitive (that is at least 150 nm and up to and including 475 nm), thereby facilitating photopolymerization. In some other embodiments, the radiation sensitive compositions are sensitized to "violet" radiation in the range of at least 375 nm and up to and including 475 nm. Useful sensitizers for such compositions include certain pyrilium and thiopyrilium dyes and 3-ketocoumarins. Some other useful sensitizers for such spectral sensitivity are described for example, in U.S. Pat. No. 6,908,726 (Korionoff et al.) and WO 2004/074929 (Baumann et al.) that describes useful bisoxazole derivatives and analogues, and U.S. Patent Application Publications 2006/0063101 and 2006/0234155 (both Baumann et al.).

Still other useful sensitizers are the oligomeric or polymeric compounds having Structure (I) units defined in WO 2006/053689 (Strehmel et al.) that have a suitable aromatic or heteroaromatic unit that provides a conjugated n-system between two heteroatoms.

Additional useful "violet"-visible radiation sensitizers are the compounds described in WO 2004/074929 (Baumann et al.). These compounds comprise the same or different aromatic heterocyclic groups connected with a spacer moiety that comprises at least one carbon-carbon double bond that is conjugated to the aromatic heterocyclic groups, and are represented in more detail by Formula (I) of the noted publication.

Other useful sensitizers for the violet region of sensitization are the 2,4,5-triaryloxazole derivatives as described in WO 2004/074930 (Baumann et al.). These compounds can be used alone or with a co-initiator as described above. Useful 2,4,5-triaryloxazole derivatives can be represented by the Structure G-$(Ar_1)_3$ wherein $Ar_1$ is the same or different, substituted or unsubstituted carbocyclic aryl group having 6 to 12 carbon atoms in the ring, and G is a furan or oxazole ring, or the Structure G-$(Ar_1)_2$ wherein G is an oxadiazole ring. The $Ar_1$ groups can be substituted with one or more halo, substituted or unsubstituted alkyl, substituted or unsubstituted cycloalkyl, substituted or unsubstituted aryl, amino (primary, secondary, or tertiary), or substituted or unsubstituted alkoxy or aryloxy groups. Thus, the aryl groups can be substituted with one or more $R'_1$ through $R'_3$ groups, respectively, that are independently hydrogen or a substituted or unsubstituted alkyl group having from 1 to 20 carbon atoms (such as methyl, ethyl, iso-propyl, n-hexyl, benzyl, and methoxymethyl groups) substituted or unsubstituted carbocyclic aryl group having 6 to 10 carbon atoms in the ring (such as phenyl, naphthyl, 4-methoxyphenyl, and 3-methylphenyl groups), substituted or unsubstituted cycloalkyl group having 5 to 10 carbon atoms in the ring, a —$N(R'_4)(R'_5)$ group, or a —$OR'_6$ group wherein $R'_4$ through $R'_6$ independently represent substituted or unsubstituted alkyl or aryl groups as defined above. At least one of $R'_1$ through $R'_3$ is an —$N(R'_4)(R'_5)$ group wherein $R'_4$ and $R'_5$ are the same or different alkyl groups. Useful substituents for each $Ar_1$ group include the same or different primary, secondary, and tertiary amines.

Still another class of useful violet radiation sensitizers includes compounds represented by the Structure $Ar_1$-G-$Ar_2$ wherein $Ar_1$ and $Ar_2$ are the same or different substituted or unsubstituted aryl groups having 6 to 12 carbon atoms in the ring, or $Ar_2$ can be an arylene-G-$Ar_1$ or arylene-G-$Ar_2$ group, and G is a furan, oxazole, or oxadiazole ring. An is the same as defined above, and $Ar_2$ can be the same or different aryl group as $Ar_1$. "Arylene" can be any of the aryl groups defined for $Ar_1$ but with a hydrogen atom removed to render them divalent in nature.

Some useful infrared radiation absorbers are sensitive to both infrared radiation (typically of at least 700 and up to and including 1400 nm) and visible radiation (typically of at least 450 and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.).

Other useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes having IR dye chromophores bonded to polymers can be used as well. Moreover, IR dye cations can be used as well, that is, the cation is the IR absorbing portion of the dye salt that ionically interacts with a polymer comprising carboxy, sulfa, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful IR-radiation sensitive compositions are described, for example, in U.S. Pat. No. 7,452,638 (Yu et al.), and U.S. Patent Application Publications 2008/0254387 (Yu et al.), 2008/0311520 (Yu et al.), 2009/0263746 (Ray et al.), and 2010/0021844 (Yu et al.).

The imageable layer can also include a poly(alkylene glycol) or an ether or ester thereof that has a molecular weight of at least 200 and up to and including 4000. The imageable layer can further include a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The imageable layer also optionally includes a phosphate (meth)acrylate having a molecular weight generally greater than 250 as described in U.S. Pat. No. 7,429,445 (Munnelly et al.) that is incorporated herein by reference.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The radiation-sensitive composition can also be applied by spraying onto a suitable support (such as an on-press printing cylinder). Typically, the radiation-sensitive composition is applied and dried to form an imageable layer.

The precursor can have a water-soluble or water-dispersible overcoat (also sometimes known as an "oxygen impermeable topcoat" or "oxygen barrier layer") disposed over the imageable layer. The topcoat can be the outermost layer. Such overcoat layers can comprise one or more water-soluble poly (vinyl alcohol)s having a saponification degree of at least 90% and generally have a dry coating weight of at least 0.1 and up to and including 2 $g/m^2$ in which the water-soluble poly(vinyl alcohol)s comprise at least 60% and up to and including 99% of the dry overcoat layer weight.

The overcoat can further comprise a second water-soluble polymer that is not a poly(vinyl alcohol) in an amount of from about 2 to about 38 weight %, and such second water-soluble polymer can be a poly(vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, and vinyl imidazole, and vinyl acetamide.

Alternatively, the overcoat can be formed predominantly using one or more of polymeric binders such as poly(vinyl pyrrolidone), poly(ethyleneimine), poly(vinyl imidazole), and random copolymers from two or more of vinyl pyrrolidone, ethyleneimine and vinyl imidazole, and mixtures of such polymers. The formulations can also include cationic, anionic, and non-ionic wetting agents or surfactants, flow improvers or thickeners, antifoamants, colorants, particles such as aluminum oxide and silicon dioxide, and biocides. Details about such addenda are provided in WO 99/06890 (Pappas et al.) that is incorporated by reference. However, in some embodiments, a water-soluble or water-dispersible overcoat is not desired or present in the precursor and the imageable layer is the outermost layer in the precursor.

Illustrative of such manufacturing methods is mixing the various components needed for a specific imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Invention Examples below. After proper drying, the coating weight of the imageable layer is generally at least 0.1 and up to and including 5 $g/m^2$ or at least 0.5 and up to and including 3.5 $g/m^2$.

Layers can also be present under the imageable layer to enhance developability or to act as a thermal insulating layer.

Once the various layers have been applied and dried on the substrate of this invention, the negative-working lithographic printing plate precursors can be enclosed in water-impermeable material that substantially inhibits the transfer of moisture to and from the element and "heat conditioned" as described in U.S. Pat. No. 7,175,969 (noted above) that is incorporated herein by reference.

The lithographic printing plate precursors can be stored and transported as stacks of precursors within suitable packaging and containers known in the art.

Positive-Working Lithographic Printing Plate Precursors

Some of the lithographic printing plate precursors of the present invention are positive-working and include one or more layers disposed on the substrate of this invention.

Some embodiments of such positive-working lithographic printing plate precursors comprise a single imageable surface layer while other embodiments comprise an inner layer and an outer surface layer disposed on the inner layer.

The lithographic printing plate precursors can rely on an infrared radiation absorbing compound dispersed within one or more polymeric binders that, upon suitable irradiation, are soluble, dispersible, or removable in processing solutions including alkaline developers. Thus, the imageable layer(s), upon irradiation, undergoes a change in solubility properties with respect to the processing solution in its irradiated (exposed) regions.

For example, "single-layer" positive-working lithographic printing plate precursors are described for example, in EP 1,543,046 (Timpe et al.), WO 2004/081662 (Memetea et al.), U.S. Pat. No. 6,255,033 (Levanon et al.), U.S. Pat. No. 6,280,899 (Hoare et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), EP 1,627,732 (Hatanaka et al.), and U.S. Published Patent Applications 2005/0214677 (Nagashima), 2004/0013965 (Memetea et al.), 2005/0003296 (Memetea et al.), and 2005/0214678 (Nagashima).

The surface layer can contain one or more phenolic polymeric binders that are generally soluble in alkaline developers (defined below) after thermal imaging. In most embodiments of the lithographic printing plate precursors, these polymeric binders are present in an amount of at least 10 weight % and typically from at least 20 and up to and including 80 weight % of the total dry imageable layer weight. By "phenolic", we mean a hydroxyl-substituted phenyl group.

Useful phenolic polymers include but are not limited to, poly(vinyl phenols) or derivatives thereof. They can also include pendant acidic groups such as carboxylic (carboxy), sulfonic (sulfo), phosphonic (phosphono), or phosphoric acid groups that are incorporated into the polymer molecule or pendant to the polymer backbone. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such resins have a number average molecular weight of at least 3,000 and up to and including 200,000, and typically at least 6,000 and up to and including 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or an m,p-cresol mixture with formaldehyde using conventional conditions. For example, some useful novolak resins include but are not limited to, xylenol-cresol resins, for example, SPN400, SPN420, SPN460, and VPN1100 (that are available from AZ Electronics) and EP25D40G and EP25D50G (noted below for the Examples) that have higher molecular weights, such as at least 4,000.

Other useful additional resins include polyvinyl compounds having phenolic hydroxyl groups, include poly(hydroxystyrenes) and copolymers containing recurring units of a hydroxystyrene and polymers and copolymers containing recurring units of substituted hydroxystyrenes. Also useful are branched poly(hydroxystyrenes) having multiple branched hydroxystyrene recurring units derived from 4-hydroxystyrene as described for example in U.S. Pat. No. 5,554,719 (Sounik) and U.S. Pat. No. 6,551,738 (Ohsawa et al.), and U.S. Published Patent Applications 2003/0050191 (Bhatt et al.), 2005/0051053 (Wisnudel et al.), and 2008/2008/0008956 (Levanon et al.). For example, such branched hydroxystyrene polymers comprise recurring units derived from a hydroxystyrene, such as from 4-hydroxystyrene, which recurring units are further substituted with repeating hydroxystyrene units (such as 4-hydroxystyrene units) positioned ortho to the hydroxy group. These branched polymers can have a weight average molecular weight ($M_w$) of at least 1,000 and up to and including 30,000. In addition, they can have a polydispersity of less than 2. The branched poly(hydroxystyrenes) can be homopolymers or copolymers with non-branched hydroxystyrene recurring units.

Another group of useful polymeric binders are poly(vinyl phenol) and derivatives thereof. Such polymers are obtained generally by polymerization of vinyl phenol monomers, that is, substituted or unsubstituted vinyl phenols. Some vinyl phenol copolymers are described in EP 1,669,803A (Barclay et al.).

The positive-working lithographic printing plate precursor also includes one or more radiation absorbers in the surface imageable layer. Such compounds are sensitive to near-infrared or infrared radiation, for example of at least 700 and up to and including 1400 nm and typically at least 700 and up to and including 1200 nm. Examples of useful infrared radiation absorbers are described above.

The radiation absorbing compound (or sensitizer) can be present in the imageable layer in an amount generally of at least 0.5% and up to and including 30% and typically at least 3 and up to and including 20%, based on total solids. The particular amount needed for this purpose would be readily apparent to one skilled in the art, depending upon the specific compound used to provide the desired chromophore.

In some embodiments, the infrared radiation absorber is present in the single surface imageable layer. Alternatively or additionally, the infrared radiation absorbers are located in a separate layer that is in thermal contact with the single surface imageable layer. Thus, during imaging, the action of the infrared radiation absorber can be transferred to the single surface imageable layer without the compound originally being incorporated into it.

The single-layer surface imageable element can be prepared by applying the layer formulation to the substrate of this invention (including any hydrophilic layers on an aluminum sheet or cylinder) using conventional coating or lamination methods. Thus, the formulations can be applied by dispersing or dissolving the desired ingredients in a suitable coating solvent, and the resulting formulations are sequentially or simultaneously applied to the substrate of this invention using suitable equipment and procedures, such as spin coating, knife coating, gravure coating, die coating, slot coating, bar coating, wire rod coating, roller coating, or extrusion hopper coating. The formulations can also be applied by spraying onto a suitable substrate.

The coating weight for the single surface imageable layer can be from about 0.5 to about 2.5 g/m$^2$ and typically from about 1 to about 2 g/m$^2$.

The selection of solvents used to coat the surface imageable layer formulation depends upon the nature of the polymeric materials and other components in the formulations. Generally, the formulation is coated out of acetone, methyl ethyl ketone, or another ketone, tetrahydrofuran, 1-methoxypropan-2-ol, 1-methoxy-2-propyl acetate, and mixtures thereof using conditions and techniques well known in the art. The coated layer can be dried in a suitable manner.

Other positive-working lithographic printing plate precursors of this invention are multi-layer imageable elements comprise a substrate of this invention, an inner layer (also known in the art as an "underlayer"), and an outer surface layer (also known in the art as a "top layer" or "topcoat") disposed over the inner layer. Before thermal imaging, the outer layer is generally not soluble or removable by an alkaline developer within the usual time allotted for development, but after thermal imaging, the exposed regions of the outer surface layer are soluble in the alkaline developer. The inner layer is also generally removable by the alkaline developer. An infrared radiation absorber (described above) can also be present in such imageable elements, and is typically present in the inner layer but can optionally be in a separate layer between the inner and outer layers. Useful IR radiation absorbers are described above.

Thermally imageable, multi-layer lithographic printing plate precursors are described, for example, in U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar-Hauck et al.), U.S. Pat. No. 6,528,228 (Savariar-Hauck et al.), U.S. Pat. No. 7,163,770 (Saraiya et al.), U.S. Pat. No. 7,163,777 (Ray et al.), U.S. Pat. No. 7,186,482 (Kitson et al.), U.S. Pat. No. 7,223,506 (noted above), U.S. Pat. No. 7,229,744 (Patel), U.S. Pat. No. 7,241,556 (Saraiya et al.), U.S. Pat. No. 7,247,418 (noted above), U.S. Pat. No. 7,291,440 (Ray et al.), U.S. Pat. No. 7,300,726 (Patel et al.), and U.S. Pat. No. 7,338,745 (Ray et al.), U.S. Patent Application Publications 2004/0067432 A1 (Kitson et al.) and 2005/0037280 (Loccufier et al.).

These multi-layer lithographic printing plate precursors are formed by suitable application of an inner layer composition onto a suitable substrate of this invention.

The inner layer is disposed between the outer surface layer and the substrate of this invention. Typically, it is disposed directly on the substrate (including any hydrophilic coatings as described above). The inner layer comprises a first polymeric binder that is removable by the lower pH processing solution of this invention and typically soluble in that processing solution to reduce sludging. In addition, the first polymeric binder is usually insoluble in the solvent used to coat the outer surface layer so that the outer surface layer can be coated over the inner layer without dissolving the inner layer. Mixtures of these first polymeric binders can be used if desired in the inner layer. Such polymeric binders are generally present in the inner layer in an amount of at least 10 weight %, and generally at least 60 and up to and including 95 weight % of the total dry inner layer weight.

In most embodiments, the inner layer further comprises an infrared radiation absorber (as described above) that absorbs radiation of at least 700 and up to and including 1400 and typically of at least 700 and up to and including 1200 nm. In most embodiments, the infrared radiation absorber is present only in the inner layer. The infrared radiation absorber can be present in the multi-layer lithographic printing plate precursor in an amount of generally at least 0.5% and up to and including 30% and typically at least 3 and up to and including 25%, based on the total dry weight of the layer in which the compound is located. The particular amount of a given compound to be used could be readily determined by one skilled in the art.

The outer surface layer of the imageable element is disposed over the inner layer and in most embodiments there are no intermediate layers between the inner and outer surface layers. The outer surface layer generally comprises a second polymeric binder that is usually different than the first polymeric binder described above for the inner layer. This second polymeric binder is a phenolic polymeric binder as described above for the single-layer lithographic printing plate precursor. In many embodiments, the outer surface layer is substantially free of infrared radiation absorbers, meaning that none of these compounds are purposely incorporated therein and insubstantial amounts diffuse into it from other layers. However, in other embodiments, the infrared radiation absorbing compound can be in both the outer surface and inner layers, as described for example in EP 1,439,058A2 (Watanabe et al.) and EP 1,738,901A1 (Lingier et al.), or in an intermediate layer as described above.

The outer surface layer can also include colorants as described for example in U.S. Pat. No. 6,294,311 (noted above) including triarylmethane dyes such as ethyl violet, crystal violet, malachite green, brilliant green, Victoria blue B, Victoria blue R, and Victoria pure blue BO. These compounds can act as contrast dyes that distinguish the non-exposed regions from the exposed regions in the developed imageable element. The outer surface layer can optionally also include contrast dyes, printout dyes, coating surfactants, dispersing aids, humectants, biocides, viscosity builders, drying agents, defoamers, preservatives, and antioxidants.

The multi-layer lithographic printing plate precursors can be prepared by sequentially applying an inner layer formulation over the surface of the substrate of this invention, and then applying an outer layer formulation over the inner layer using conventional coating or lamination methods. It is important to avoid intermixing of the inner and outer surface layer formulations.

The inner and outer surface layers can be applied by dispersing or dissolving the desired ingredients in a suitable coating solvent, and the resulting formulations are sequentially or simultaneously applied to the substrate using suitable equipment and procedures, such as spin coating, knife coating, gravure coating, die coating, slot coating, bar coating, wire rod coating, roller coating, or extrusion hopper coating. The formulations can also be applied by spraying onto the substrate.

The selection of solvents used to coat both the inner and outer surface layers depends upon the nature of the first and second polymeric binders, other polymeric materials, and other components in the formulations. To prevent the inner and outer surface layer formulations from mixing or the inner layer from dissolving when the outer surface layer formulation is applied, the outer surface layer formulation should be coated from a solvent in which the first polymeric binder(s) of the inner layer are insoluble.

Generally, the inner layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

The outer surface layer formulation can be coated out of solvents or solvent mixtures that do not dissolve the inner layer. Typical solvents for this purpose include but are not limited to, butyl acetate, iso-butyl acetate, methyl iso-butyl ketone, DEK, 1-methoxy-2-propyl acetate (PMA), iso-propyl alcohol, PGME and mixtures thereof. Particularly useful is a mixture of DEK and PMA, or a mixture of DEK, PMA, and isopropyl alcohol.

After drying the layers, the lithographic printing plate precursors can be further "conditioned" with a heat treatment for at least 40 and up to and including 90° C. for at least 4 hours (for example, at least 20 hours) under conditions that inhibit the removal of moisture from the dried layers. For example, the heat treatment is carried out for at least 50 and up to and including 70° C. for at least 24 hours. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%. In addition, the water-impermeable sheet material can be sealed around the edges of the precursors, with the water-impermeable sheet material being a polymeric film or metal foil that is sealed around the edges of the precursors.

In some embodiments, this heat treatment can be carried out with a stack comprising at least 100 of the same lithographic printing plate precursors, or when the precursor is in the form of a coil or web. When conditioned in a stack, the individual precursors can be separated by suitable interleaving papers. The interleaving papers can be kept between the imageable elements after conditioning during packing, shipping, and use by the customer.

Imaging Conditions

During use, the lithographic printing plate precursor is exposed to a suitable source of exposing radiation depending upon the radiation absorber present in the radiation-sensitive composition to provide specific sensitivity that is at a wavelength of at least 150 nm and up to and including 475 nm or infrared of at least 700 nm and up to and including 1400 nm. In some embodiments, imagewise exposure is carried out using radiation the range of at least 350 nm and up to and including 450 nm, or in the range of at least 700 nm and up to and including 1250 nm.

For example, imaging can be carried out using imaging or exposing radiation from an infrared radiation-generating laser (or array of such lasers). Imaging also can be carried out using imaging radiation at multiple wavelengths at the same time if desired. The laser used to expose the lithographic printing plate precursor is usually a diode laser, because of the reliability and low maintenance of diode laser systems, but other lasers such as gas or solid-state lasers can also be used. The combination of power, intensity and exposure time for laser imaging would be readily apparent to one skilled in the art.

The imaging apparatus can be configured as a flatbed recorder or as a drum recorder, with the lithographic printing plate precursor mounted to the interior or exterior cylindrical surface of the drum. An example of an useful imaging apparatus is available as models of Kodak® Trendsetter platesetters available from Eastman Kodak Company that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300, series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$, and typically at least 50 mJ/cm$^2$ and up to and including 300 mJ/cm$^2$ depending upon the sensitivity of the imageable layer. With these platesetters, any imaging parameters such as the "surface depth" parameter of a Magnus 800 platesetter (Eastman Kodak Company) or the "focus" parameter of a PlateRite 4300 platesetter (Dainippon Screen Company), are decided by observing the difference in contrast between exposed regions and non-exposed regions in a stepwise imaging process. By using such as stepwise imaged lithographic printing plate precursor, a shortened printing run is possible and the obtained prints are also useful for determining such imaging parameters.

Useful UV and "violet" imaging apparatus include Prosetter (from Heidelberger Druckmaschinen, Germany), Luxel V-8 (from FUJI, Japan), Python (Highwater, UK), MakoNews, Mako 2, Mako 4 or Mako 8 (from ECRM, US), Micra (from Screen, Japan), Polaris and Advantage (from AGFA, Belgium), Laserjet (from Krause, Germany), and Andromeda® A750M (from Lithotech, Germany), imagesetters.

Imaging radiation in the UV to visible region of the spectrum, and particularly the UV region (for example at least 150 nm and up to and including 475 nm), can be carried out generally using energies of at least 0.01 mJ/cm$^2$ and up to and including 0.5 mJ/cm$^2$, and typically at least 0.02 mJ/cm$^2$ and up to and including about 0.1 mJ/cm$^2$. It would be desirable, for example, to image the UV/visible radiation-sensitive imageable elements at a power density in the range of at least 0.5 kW/cm$^2$ and up to and including 50 kW/cm$^2$ and typically of at least 5 kW/cm$^2$ and up to and including 30 kW/cm$^2$, depending upon the source of energy (violet laser or excimer sources).

While laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

After imaging, the imaged lithographic printing plate precursors can be processed "off-press" using a suitable processing solution described herein, for example using water or an alkaline processing solution. Such processing is carried out with imaged negative-working precursors for a time sufficient to remove the non-exposed regions of the imaged imageable layer to reveal the hydrophilic surface of the substrate of this invention, but not long enough to remove significant amounts of the exposed regions that have been hardened. The revealed hydrophilic substrate surface repels inks while the exposed regions accept ink. Thus, the non-exposed regions to be removed are "soluble" or "removable" in the processing solution because they are removed, dissolved, or dispersed within it more readily than the regions that are to remain. The term "soluble" also means "dispersible". This processing can also remove the hydrophilic layer described above on the substrate in the non-exposed regions.

When positive-working lithographic printing plate precursors are imaged and processed, the imaged (exposed) regions are removed during processing while the non-exposed regions remain, revealing the hydrophilic substrate of this invention under the exposed regions. During such processing off-press, the hydrophilic layer described above also can be removed in the exposed regions.

Development off-press can be accomplished using what is known as "manual" development, "dip" development, or processing with an automatic development apparatus (processor). In the case of "manual" development, development is conducted by rubbing the entire imaged element with a sponge or cotton pad sufficiently impregnated with a suitable developer (described below), and followed by rinsing with water. "Dip" development involves dipping the imaged element in a tank or tray containing the appropriate developer for at least 10 and up to and including 60 seconds (especially at least 20 and up to and including 40 seconds) under agitation, followed by rinsing with water with or without rubbing with a sponge or cotton pad. The use of automatic development apparatus is well known and generally includes pumping a developer or processing solution into a developing tank or ejecting it from spray nozzles. The imaged precursor is contacted with the developer in an appropriate manner. The apparatus can also include a suitable rubbing mechanism (for example a brush or roller) and a suitable number of conveyance rollers. Some developing apparatus include laser exposure means and the apparatus is divided into an imaging section and a developing section.

Both aqueous alkaline developers and organic solvent-containing developers or processing solutions can be used. Some useful developer solutions are described for example, in U.S. Pat. No. 7,507,526 (Miller et al.) and U.S. Pat. No. 7,316,894 (Miller et al.). Developer solutions commonly include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Useful alkaline aqueous developer solutions include 3000 Developer, 9000 Developer, GOLDSTAR Developer, GREENSTAR Developer, ThermalPro Developer, PRO-THERM Developer, MX1813 Developer, and MX1710 Developer (all available from Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 and up to 15% based on total developer weight. The organic solvent-containing developers can be neutral, alkaline, or slightly acidic in pH, and typically, they are alkaline in pH. Representative organic solvent-containing developers include ND-1 Developer, Developer 980, Developer 1080, 2 in 1 Developer, 955 Developer, D29 Developer (described below), and 956 Developer (all available from Eastman Kodak Company).

The processing solution (or developer) can be applied to the imaged precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the outer layer with the processing solution or contacting it with a roller, impregnated pad, or applicator. For example, the imaged precursor can be brushed with the processing solution, or it can be poured onto or applied by spraying the imaged surface with sufficient force to remove the non-exposed regions using a spray nozzle system as described for example in [0124] of EP 1,788,431A2 (noted above) and U.S. Pat. No. 6,992,688 (Shimazu et al.). As noted above, the imaged precursor can be immersed in the processing solution and rubbed by hand or with an apparatus. To assist in the removal of the back side coating, a brush roller or other mechanical component can be placed in contact with the back side coating during processing. Alternatively, the processing solution can be sprayed using a spray bar using a sufficient force.

The processing solution can also be applied in a processing unit (or station) in a suitable apparatus that has at least one roller for rubbing or brushing the imaged precursor while the processing solution is applied. Residual processing solution can be removed (for example, using a squeegee or nip rollers) or left on the resulting lithographic printing plate without any rinsing step. Excess processing solution can be collected in a tank and used several times, and replenished if necessary from a reservoir. The processing solution replenisher can be of the same concentration as that used in processing, or be provided in concentrated form and diluted with water at an appropriate time.

Following off-press development, the resulting lithographic printing plate can be postbaked with or without blanket or floodwise exposure to UV or visible radiation. Alternatively, a blanket UV or visible radiation exposure can be carried out, without a postbake operation.

Printing can be carried out by putting the imaged and developed lithographic printing plate on a suitable printing press. The lithographic printing plate is generally secured in the printing plate using suitable clamps or other holding devices. Once the lithographic printing plate is secured in the printing press, printing is carried out by applying a lithographic printing ink and fountain solution to the printing surface of the lithographic printing plate. The fountain solution is taken up by the surface of the hydrophilic substrate revealed by the imaging and processing steps, and the ink is taken up by the remaining regions of the imageable layer. The ink is then transferred to a suitable receiving material (such as cloth, paper, metal, glass, or plastic) to provide a desired impression of the image thereon. If desired, an intermediate "blanket" roller can be used to transfer the ink from the lithographic printing plate to the receiving material (for example, sheets of paper). The lithographic printing plates can be cleaned between impressions, if desired, using conventional cleaning means.

For the imaged negative-working lithographic printing plate precursors that are designed for on-press development, the imaged lithographic printing plate precursor is mounted on press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate of this invention revealed by the imaging and development steps, and ink is taken up by the imaged (exposed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged precursor to the receiving material. The imaged precursors can be cleaned between impressions, if desired, using conventional cleaning means.

The present invention provides at least the following embodiments and combinations thereof, but other combinations of features are considered to be within the present invention as a skilled artisan would appreciate from the teaching of this disclosure:

1. A substrate comprising a grained and sulfuric acid anodized aluminum-containing support, which support has also been treated with an alkaline or acidic pore-widening solution to provide its outer surface with columnar pores so that the diameter of the columnar pores at their outermost surface is at least 90% of the average diameter of the columnar pores, the substrate further comprising a hydrophilic layer disposed directly on the electrochemically grained, sulfuric acid anodized, and treated aluminum-containing support, the hydrophilic layer comprising a non-crosslinked hydrophilic polymer having carboxylic acid side chains.

2. The substrate of embodiment 1 wherein the non-crosslinked hydrophilic polymer is present at a dry coverage of at least 0.001 g/m$^2$ and up to and including 0.4 g/m$^2$.

3. The substrate of embodiment 1 or 2 wherein the non-crosslinked hydrophilic polymer has partially neutralized carboxylic acid side chains.

4. The substrate of any of embodiments 1 to 3 wherein the non-crosslinked hydrophilic polymer has carboxylic acid side chains that are neutralized to a degree of at least 1 mol % and up to and including 60 mol %.

5. The substrate of any of embodiments 1 to 4 wherein the hydrophilic layer is a releasable layer.

6. The substrate of any of embodiments 1 to 5 wherein the hydrophilic layer is present at a dry coverage of at least 0.01 g/m$^2$ and up to and including 0.3 g/m$^2$.

7. The substrate of any of embodiments 1 to 6 wherein the hydrophilic layer is a non-radiation-sensitive hydrophilic layer.

8. The substrate of any of embodiments 1 to 7 wherein the grained and sulfuric acid anodized and treated aluminum-containing support has columnar pores having an average diameter of at least 20 nm and up to and including 40 nm.

9. The substrate of any of embodiments 1 to 8 wherein at least 10 weight % and up to and including 80 weight % of the original aluminum oxide from sulfuric acid anodization has been removed by treatment with the alkaline or acidic pore-widening solution.

10. The substrate of any of embodiments 1 to 9 wherein the hydrophilic layer further comprises an inorganic phosphoric acid or a precursor of an inorganic phosphoric acid.

11. A lithographic printing plate precursor comprising a substrate of any of embodiments 1 to 10 and at least one radiation-sensitive imageable layer disposed over the substrate without any intermediate post-treatment layer on the substrate, the radiation-sensitive imageable layer comprising a radiation absorber.

12. The precursor of embodiment 11 that is a negative-working lithographic printing plate precursor having a negative-working radiation-sensitive imageable layer comprising a free radically polymerizable compound, the radiation absorber, and a compound to generate free radicals upon irradiation.

13. The precursor of embodiment 11 or 12 that is a negative-working lithographic printing plate precursor having a negative-working, infrared radiation-sensitive imageable layer comprising a free radically polymerizable compound, an infrared radiation absorber, and a compound to generate free radicals upon irradiation.

14. A method of preparing a lithographic printing plate comprising:

imagewise exposing the lithographic printing plate precursor of any of embodiments 11 to 13 to provide an exposed precursor having exposed and non-exposed regions in the radiation-sensitive imageable layer, and processing the exposed precursor to remove either the non-exposed regions or the exposed regions to provide a lithographic printing plate.

15. The method of embodiment 14 wherein the processing further removes the hydrophilic layer in either the non-exposed regions or the exposed regions that are removed.

16. The method of embodiment 14 or 15 wherein the lithographic printing plate precursor is a positive-working lithographic printing plate precursor, and processing the exposed precursor is carried out off-press to remove the exposed regions to provide a lithographic printing plate using an alkaline processing solution.

17. The method of embodiment 14 or 15 wherein the lithographic printing plate precursor is a negative-working lithographic printing plate precursor, and processing of the exposed precursor is carried out off-press using water or an alkaline processing solution to remove the non-exposed regions to provide a lithographic printing plate.

18. A lithographic printing plate obtained by the method of any of embodiments 14 to 17 wherein the lithographic printing plate comprises a substrate having thereon either exposed portions or non-exposed portions of a radiation-sensitive imageable layer.

19. A method for preparing an aluminum-containing article, comprising:

treating a grained and sulfuric acid anodized aluminum-containing support with an alkaline or acidic pore-widening solution to provide columnar pores in the outer surface so that the diameter of the columnar pores at their outermost surface is at least 90% of the average diameter of the columnar pores, to provide a substrate, and without post-treating the substrate, forming a hydrophilic layer directly on the substrate from a hydrophilic layer formulation, the hydrophilic layer comprising a non-crosslinked hydrophilic polymer having carboxylic acid side chains, the non-crosslinked hydrophilic polymer being applied to a dry coverage of at least 0.001 g/m$^2$ and up to and including 0.4 g/m$^2$ to form the substrate of any of embodiments 1 to 10.

20. The method of embodiment 19 comprising treating the grained and sulfuric acid anodized aluminum-containing support to remove at least 10 weight % and up to and including 80 weight % of the original aluminum oxide from sulfuric acid anodization using the alkaline or acidic pore-widening solution.

21. The method of embodiment 19 or 20 further comprising forming a negative-working radiation-sensitive imageable layer directly on the hydrophilic layer.

22. The method of any of embodiments 19 to 21 comprising treating the grained and sulfuric acid anodized aluminum-containing support with the alkaline or acidic pore-widening solution that comprises sodium hydroxide, potassium hydroxide, sulfuric acid, hydrochloric acid, nitric acid, or phosphoric acid, or mixtures of the acids or mixtures of the hydroxides.

23. The method of any of embodiments 19 to 22 comprising treating the grained and sulfuric acid anodized aluminum-containing support with the alkaline or acidic widening solution at a temperature of at least 20° C. for at least 3 seconds for pore widening to provide columnar pores having an average diameter of at least 20 nm and up to and including 40 nm.

24. The method of any of embodiments 19 to 23 wherein the hydrophilic layer formulation consists essentially of a non-crosslinked hydrophilic polymer and an inorganic phosphoric acid.

The following Examples are provided to illustrate the practice of this invention and are not meant to be limiting in any manner. The following materials were used in the preparation and evaluation of the Examples:

On-Press Developable Lithographic Printing Plate Precursors:

G2 Support without Hydrophilic Layer:

An electrochemically grained, sulfuric acid-anodized aluminum support having no hydrophilic layer was prepared ($R_a$=0.4 µm, OD=0.3, and oxide weight of 2.7 g/m$^2$). $R_a$ is the average roughness of the support surface and OD is the optical density of the support. Both parameters are measured using known measuring techniques and apparatus.

PW1 Support:

The noted G2 support was treated with a 0.3 weight % sodium hydroxide solution for 17 seconds at 40° C. for pore widening. The resulting substrate was washed with de-ionized water and dried at 100° C. for 60 seconds.

PW2 Support:

The noted G2 support was treated with an alkaline solution of 0.25 weight % of sodium hydroxide and 1.06 weight % of sodium carbonate for 17 seconds at 40° C. The resulting substrate was washed with de-ionized water and dried at 100° C. for 60 seconds.

PW3 Support:

The noted G2 support was further treated with an alkaline solution of 0.28 weight % of sodium hydroxide for 17 seconds at 40° C. The resulting substrate was washed with de-ionized water and dried at 100° C. for 60 seconds.

PW4 Support:

The noted G2 support was further treated with an acid solution of 1.0 weight % of hydrogen chloride for 17 seconds at 45° C. The resulting substrate was washed with de-ionized water and dried at 100° C. for 60 seconds.

The following TABLE I summarizes the various supports:

TABLE I

| Component | D1* | D2** | D1/D2 |
|---|---|---|---|
| G2 support | 8.14 nm | | |
| PW1 support | 29.79 nm | 27.84 nm | 107% |
| PW2 support | 29.25 nm | | |
| PW3 support | 25.74 nm | | |
| PW4 support | 23.12 nm | | |

*D1 is the diameter of the columnar pores at their outermost surface
**D2 is the average diameter of the columnar pores D1 was measured by following procedure:

A microphotograph of the support was prepared using a field emission scanning electron microscope S-4500 (Hitachi Ltd, of Tokyo Japan).

Fifty pores on each microphotograph were picked randomly and the length of the X axis and Y axis was measured for each pore.

The average diameter (D1) of each pore was determined for each microphotograph by averaging the 50 X axis and Y axis results.

D2 was measured by following procedure:

A cross-section microphotograph of the support was prepared using the field emission scanning electron microscope S-4500.

Ten pores on each cross-section microphotograph were picked randomly, and the diameter inside each pore was measured at 9 points (Z axis from the substrate surface). These observing points inside the pore were determined randomly.

The average diameter of the columnar pores was determined from the average of these 9 diameters.

D2 was determined by the diameter average of evaluations of the 10 pores.

Substrates were coated with a hydrophilic layer and dried as described below in TABLE IV using the formulations described in TABLES II and III (parts by dry weight in 0.8% aqueous solutions) below to provide a dry coating weight of 0.22 g/m$^2$ for further evaluation. The hydrophilic layer drying conditions were 120° C. for 50 seconds.

TABLE II

| Component* | SE1** | SE2** | SE3** | SE4** |
|---|---|---|---|---|
| Kemguard ™ 5041 | 72 | 0 | 94 | 47 |
| AC-10S | 0 | 43 | 0 | 0 |
| YS-100 | 0 | 29 | 0 | 0 |
| Phosphoric acid | 22 | 22 | 0 | 0 |
| NT-20 | 6 | 6 | 6 | 6 |
| PVA-103 | 0 | 0 | 0 | 47 |
| PVA-203 | 0 | 0 | 0 | 0 |
| Luvitec ™ K30 | 0 | 0 | 0 | 0 |

*Components defined below

TABLE III

| Component* | SC1** | SC2** | SC3** | SC4** | SC5 |
|---|---|---|---|---|---|
| Kemguard ™ 5041 | 0 | 0 | 0 | 0 | 0 |
| AC-10S | 72 | 0 | 0 | 0 | 0 |
| YS-100 | 0 | 72 | 0 | 0 | 0 |
| Phosphoric acid | 22 | 22 | 0 | 0 | 0 |
| NT-20 | 6 | 6 | 6 | 6 | 6 |
| PVA-103 | 0 | 0 | 94 | 0 | 0 |
| PVA-203 | 0 | 0 | 0 | 94 | 0 |
| Luvitec ™ K30 | 0 | 0 | 0 | 0 | 94 |

*Components defined below

Kemguard™ 5041 is an aqueous solution (50 weight %) of poly(acrylic acid) that was obtained from Charkit Chemical Company (Connecticut).

AC-10S is an aqueous solution (45 weight %) of poly (acrylic acid) that was obtained Toa Gosei (Tokyo, Japan).

YS-100 is an aqueous solution (40 weight %) of poly (acrylic acid, sodium salt that was obtained from Nippon Shokubai (Tokyo, Japan).

NT-20 is poly(oxyethylene)alkyl ether that was obtained from Nippon Nyukazi (Tokyo, Japan).

Luvitec™ K30 is poly(vinyl pyrrolidone) that was obtained from BASF Japan (Tokyo, Japan).

PVA-103 is a poly(vinyl alcohol) (98 mol % OH groups) that was obtained from Kuraray (Tokyo, Japan).

PVA-203 is a poly(vinyl alcohol) (88 mol % OH groups) that was obtained from Kuraray (Tokyo, Japan).

Silicate Interlayer Treatment:

An electrochemically grained, sulfuric acid-anodized aluminum-containing support was immersed in a 4 weight % sodium silicate aqueous solution for 17 seconds at 60° C. The silicate-treated support was then washed with de-ionized water and dried at 100° C. for 60 seconds.

Poly(Vinyl Phosphonic Acid) (PVPA) Interlayer Treatment:

An electrochemically grained, sulfuric acid-anodized aluminum-containing support was immersed in a 0.4 weight % of PVPA aqueous solution for 17 seconds at 60° C. The PVPA-treated support was washed with de-ionized water and dried at 100° C. for 60 seconds.

Silicate Interlayer & Hydrophilic Layer Treatment:

The silicate-treated support was immersed in a 4% sodium silicate aqueous solution for 17 seconds at 60° C. The SE1 hydrophilic layer formulation described above in TABLE II was applied to and dried on this support to provide a dry coating weight of 0.15 g/m² at 120° C. for 50 seconds, except for BC-12 that had a dry coating weight of 0.5 g/m² after drying at 120° C. for 50 seconds.

TABLE IV

| Substrate | Support | Hydrophilic Layer | Silicate | PVPA | Silicate + Hydrophilic Layer |
|---|---|---|---|---|---|
| B-1 | PW1 | SE1 | None | None | None |
| B-2 | PW2 | SE1 | None | None | None |
| B-3 | PW1 | SE2 | None | None | None |
| B-4 | PW1 | SE3 | None | None | None |
| B-5 | PW1 | SE4 | None | None | None |
| B-6 | PW3 | SE1 | None | None | None |
| B-7 | PW4 | SE1 | None | None | None |
| BC-1 | PW1 | None | None | None | None |
| BC-2 | PW1 | None | Yes | None | None |
| BC-3 | PW1 | None | None | Yes | None |
| BC-4 | PW1 | None | None | None | Yes |
| BC-5 | G2 | None | None | None | None |
| BC-6 | G2 | SE1 | None | None | None |
| BC-7 | PW1 | SC1 | None | None | None |
| BC-8 | PW1 | SC2 | None | None | None |
| BC-9 | PW1 | SC3 | None | None | None |
| BC-10 | PW1 | SC4 | None | None | None |
| BC-11 | PW1 | SC5 | None | None | None |
| BC-12 | PW1 | SE1 | None | None | None |

Onto the various substrates were coated the negative-working imageable layer formulations E1, E2, E3, E4, E5, and C1 as described below in TABLE V. Each formulation was applied as an 8 weight % solution in solvent mixture of n-propanol:propylene glycol methyl ether:methyl ethyl ketone:water (weight ratio of 4:1:4:1) and dried at 110° C. to provide a dry coating weight of 1.2 g/m².

TABLE V

| | (% solids) | | | | | |
|---|---|---|---|---|---|---|
| Component | E1 | E2 | E3 | E4 | E5 | C1 |
| Polymer 1 | 12% | 0 | 12% | 12% | 0 | 44% |
| Polymer 2 | 32% | 25% | 32% | 32% | 40% | 0 |
| A-1 | 5% | 0 | 0 | 0 | 5% | 5% |
| A-2 | 0 | 5% | 5% | 0 | 0 | 0 |
| A-3 | 0 | 0 | 0 | 5% | 0 | 0 |
| Borate A | 5% | 5% | 5% | 5% | 5% | 5% |
| Irgacure ® 250 initiator | 0 | 5% | 0 | 0 | 0 | 0 |
| Oligomer 1 | 15% | 0 | 15% | 15% | 17% | 12% |
| Oligomer 2 | 25% | 45% | 25% | 25% | 27% | 23% |
| 3-MT | 0 | 2% | 0 | 0 | 0 | 0 |
| Irganox ® 1035 | 0 | 1% | 0 | 0 | 0 | 0 |

TABLE V-continued

| | (% solids) | | | | | |
|---|---|---|---|---|---|---|
| Component | E1 | E2 | E3 | E4 | E5 | C1 |
| Klucel E | 0 | 5% | 0 | 0 | 0 | 0 |
| Naxan ® ABL | 0 | 1% | 0 | 0 | 0 | 0 |
| Leuco dye | 5% | 5% | 5% | 5% | 5% | 5% |
| Phosmer PE | 0 | 0 | 0 | 0 | 0 | 1% |
| Byk ® 337 | 1% | 1% | 1% | 1% | 1% | 1% |

The structure of Polymer 1 is represented by the following formula:

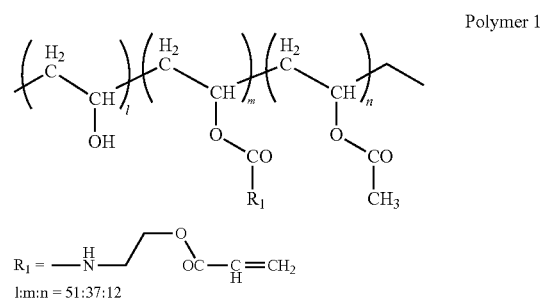

Polymer 1

$l:m:n = 51:37:12$

Polymer 2 was a 25 weight % dispersion of an acrylonitrile/polyethylene glycol methyl ether methacrylate/styrene copolymer in an 80/20 mixture of n-propanol/water, and was prepared like Polymer A described in U.S. Pat. No. 7,592,128 (Huang et al., bottom of Column 27).

A-1 had the following formula:

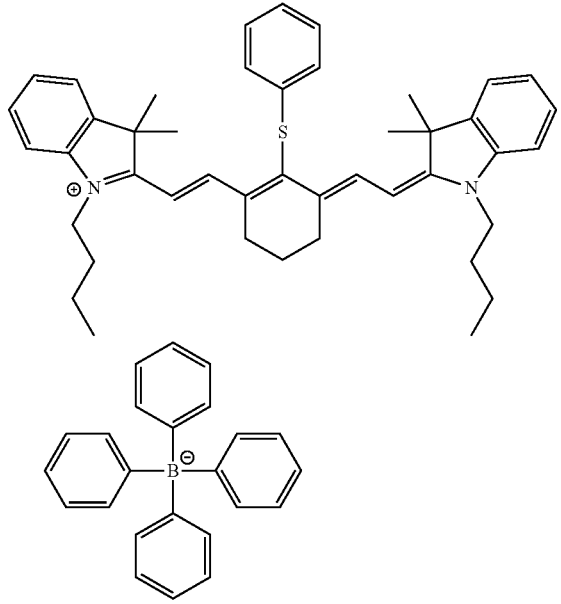

A-2 had the following formula:

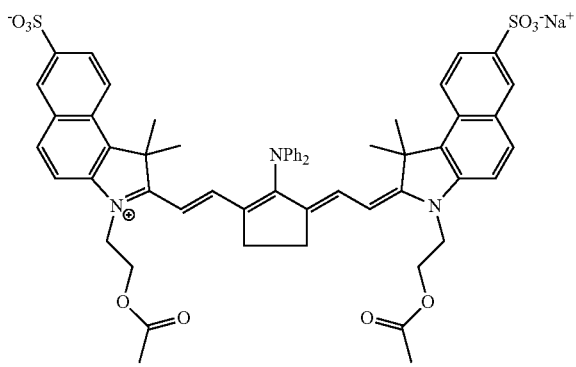

A-3 had the following formula:

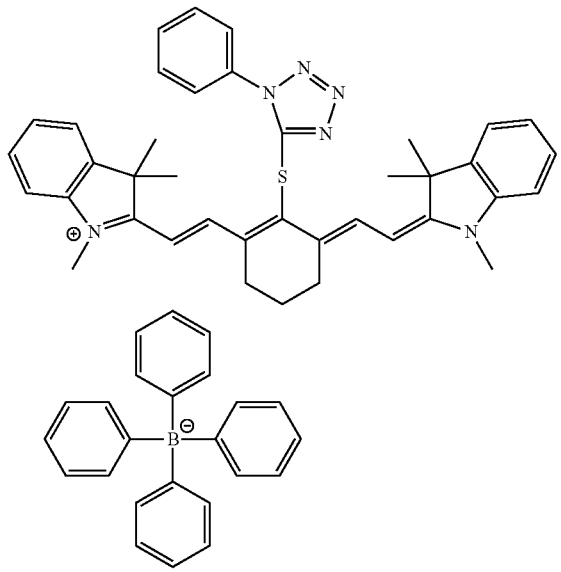

Borate A had the following formula:

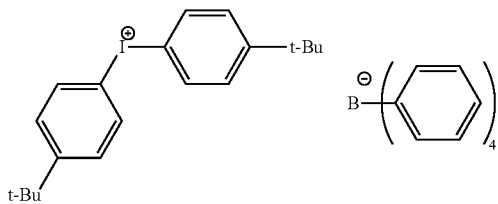

Irgacure® 250 is a 75 weight % solution of iodonium, (4-methoxyphenyl)[4-(2-methylpropyl)phenyl]-, hexafluorophosphate in propylene carbonate that is available from Ciba Specialty Chemicals (Tarrytown, N.Y.).

Oligomer 1 is a urethane acrylate as a 80 weight % solution in 2-butanone and is prepared by reacting DESMODUR® N100 (an aliphatic polyisocyanate resin based on hexamethylene diisocyanate from Bayer Corp., Milford, Conn.) with hydroxyethyl acrylate and pentaerythritol triacrylate.

Oligomer 2 is ethoxylated 4 pentaerythritol tetraacrylate that is available as SR-494 from Sartomer Japan (Yokohama, Japan).

3-MT is 3-mercapto-1,2,4-triazole that is available from Tokyo Kasei (Tokyo, Japan).

Irganox® 1035 is thio diethylene bis(3-(3,5-di-tert-butyl-4-hydroxyphenyl)propionate) that is available from Ciba Specialty Chemicals (Tarrytown, N.Y.).

Klucel E is hydroxypropylcellulose that is available from Hercules (Wilmington, Del.).

Naxan® PLUS ABL is an alkyl Naphthalene sulfonate, sodium salt that is available from NEASE Performance Chemicals.

The leuco dye is represented by the following formula:

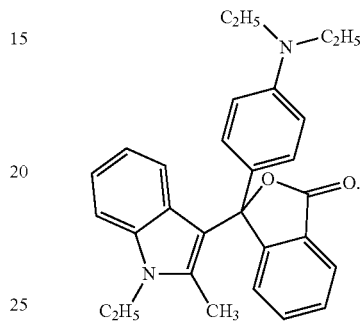

Phosmer PE is represented by the following formula and is available from Uni-chemical:

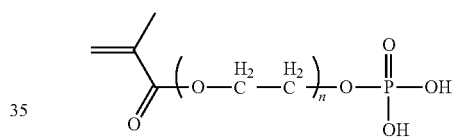

Byk® 337 is a modified dimethyl polysiloxane copolymer that is available from Byk Chemie (Wallingford, Conn.).

Printing Plate Precursors:

The detail of each printing plate precursor is shown in the following TABLE VI and the imaging and evaluation results are shown in TABLE VII below.

TABLE VI

| | Printing Plate Precursor | Substrate | Imageable Layer |
|---|---|---|---|
| Invention | 1 | B-1 | E1 |
| " | 2 | B-2 | E1 |
| " | 3 | B-3 | E1 |
| " | 4 | B-1 | E2 |
| " | 5 | B-1 | E3 |
| " | 6 | B-1 | E4 |
| " | 7 | B-1 | E5 |
| " | 8 | B-4 | E1 |
| " | 9 | B-5 | E1 |
| " | 10 | B-6 | E1 |
| " | 11 | B-7 | E1 |
| Comparison | 1 | BC-3 | E1 |
| " | 2 | BC-1 | E1 |
| " | 3 | BC-3 | C1 |
| " | 4 | BC-2 | E1 |
| " | 5 | BC-4 | E1 |
| " | 6 | BC-2 | C1 |
| " | 7 | BC-5 | E1 |
| " | 8 | BC-6 | E1 |
| " | 9 | BC-5 | C1 |
| " | 10 | BC-7 | E1 |
| " | 11 | BC-8 | E1 |

TABLE VI-continued

| Printing Plate Precursor | Substrate | Imageable Layer |
|---|---|---|
| " 12 | B-1 | C1 |
| " 13 | BC-9 | E1 |
| " 14 | BC-10 | E1 |
| " 15 | BC-11 | E1 |
| " 16 | BC-12 | E1 |

TABLE VII

| | Printing Plate Precursor | BG (start, 0 impressions) | BG (after 2,000 impressions) | Imaging Energy (mJ/cm$^2$) | LOR | DOP of Fresh Plate | DOP of Aged Plate | Blocking |
|---|---|---|---|---|---|---|---|---|
| Invention | 1 | OK | OK | 150 | A | A | B | A |
| | 2 | OK | OK | 150 | A | A | B | A |
| | 3 | OK | OK | 150 | A | A | A | A |
| | 4 | OK | OK | 200 | B | A | B | B |
| | 5 | OK | OK | 150 | A | A | B | A |
| | 6 | OK | OK | 150 | A | A | B | A |
| | 7 | OK | OK | 150 | A | B | C | A |
| | 8 | OK | OK | 150 | A | A | B | A |
| | 9 | OK | OK | 150 | A | B | C | A |
| | 10 | OK | OK | 150 | A | A | B | A |
| | 11 | OK | OK | 150 | A | B | B | A |
| Comparison | 1 | OK | OK | 150 | C | A | D | A |
| | 2 | NG | NA | NA | NA | NA | NA | NA |
| | 3 | OK | OK | 250 | C | A | E | E |
| | 4 | NG | NA | NA | NA | NA | NA | NA |
| | 5 | NG | NA | NA | NA | NA | NA | NA |
| | 6 | OK | OK | 300 | D | A | E | E |
| | 7 | NG | NA | NA | NA | NA | NA | NA |
| | 8 | OK | OK | 150 | D | A | C | B |
| | 9 | NG | NA | NA | NA | NA | NA | E |
| | 10 | OK | OK | 150 | A | B | D | A |
| | 11 | OK | NG | 150 | A | A | B | A |
| | 12 | OK | OK | 300 | C | A | B | E |
| | 13 | OK | OK | 150 | A | D | E | A |
| | 14 | OK | OK | 150 | A | C | E | A |
| | 15 | NG | NA | NA | NA | NA | NA | NA |
| | 16 | OK | OK | 150 | D | A | B | A |

In TABLE V, "BG" refers to the background scumming at press start (0 impressions) and after 2,000 printed impressions. IR speed was decided by the imaging power point that showed same ink density of 1×1 checker flag and 2×2 checker flag of Magnus 800 imagesetter (Eastman Kodak Company, 830 nm imaging wavelength, 210 rpm drum speed, 13W current setting of the laser diode at 150 mJ/cm$^2$ imaging power). "LOR" refers to the "press life" of the lithographic printing plate (an indication of durability). "DOP" refers to the developing speed of the lithographic printing plate on the printing press. The difference of DOP(fresh) and DOP(aged) indicated the aging property of each test plate. The "Blocking" property indicates the degree of tackiness for each test. "NA" means not applicable or not available. "NG" refers to a "no good" result. The evaluations "A", "B", "C", "D", and "E" represent a range of very good (A) to very poor (E).

The LOR data were obtained using a Sprint-26 printing press (Komori Corporation, Tokyo) at a speed of 9,000 rpm. The fountain solution was a mixture of 10% isopropanol and 1% K-701 (DIC, Tokyo) in water. The printer's blanket was 57400 that is available from Kinyo-sha (Tokyo). OK topcoat paper matte N grade paper (Oji Paper, Tokyo) was used for printed impressions, and the lithographic printing ink was FINE INK KPG Magenta N grade ink (DIC, Tokyo).

The BG and DOP data were obtained using a Roland 200 printing press (Man Roland Japan, Saitama Toda, Japan) that was run at 9,000 rpm. The fountain solution was a mixture 1% isopropanol and 1% NA-108W (DIC, Tokyo) in water. The printer's blanket was 57400 noted above. OK topcoat paper matte N grade paper (noted above) was used for printed impressions, and the lithographic printing ink was Fusion G Magenta N grade ink (DIC, Tokyo).

The "blocking" property was determined by cutting a lithographic printing plate precursor into samples of 10.16 cm by 12.7 cm size, and placing a pressure on them of 6.24 kg/cm$^2$ with TP-40 interleaving paper (Tokyushu-seishi, Tokyo) between the samples for five days, and then evaluating the degree of blocking from the interleaving paper between the samples.

All of the lithographic printing plate precursors of this invention comprised a substrate that had been treated for pore widening and was coated with a non-radiation sensitive hydrophilic layer comprising a non-crosslinked hydrophilic polymer having carboxylic acid side chains. Each of these invention precursors showed excellent printing performance. The lithographic printing plate precursors having no pore widening of their substrates, Comparison Examples 7 and 8, showed very poor performance. The improved effect observed with the Invention precursors was achieved from the improved adhesion of the pore-widened support and the improved on-press developability provided by the non crosslinked hydrophilic layer in the substrate.

However, even if the substrate was treated for pore widening, if the non-crosslinked hydrophilic layer contained no carboxylic acid side groups, poorer press life (LOR) was observed, as with Comparison Examples 1 and 3.

In Comparison Examples 4, 5, and 6, poorer releasability of the radiation-sensitive imageable layer was observed because the silicate interlayer in the substrate exhibits poor release of the non-imaged regions of the imageable layer during on-press printing. Most of the non-imaged imageable layer remained on the pore-widened substrate in Comparison Examples 4-6.

PVA103 and PVA203 are water-soluble polymers that do not have carboxylic side groups and when they were used as the non-radiation sensitive hydrophilic layer, the precursors exhibited relatively poor DOP (Comparison Examples 13 and 14) because of their slower water-soluble speed. On the other hand, the use of poly(vinyl pyrrolidone) provided poor results because that polymer is soluble in the imageable layer formulation solvent, and caused increased background because the imageable layer components migrated to the hydrophilic layer on the substrate.

No hydrophilic layer was present under the imageable layer in Comparison Examples 2 and 9, and the imaged lithographic printing plate precursors could not be developed on press.

Comparison Example 11 showed good on-press DOP at the start of printing, but the background of the plate showed the ink scumming gradually as printing continued because YS-100 was neutralized PAA and was easy to dissolve in the fountain solution during lithographic printing. Thus, the hydrophilic layer using in Comparison Example 11 was removed during printing on the press and ink scumming was observed after 2,000 impressions.

On the other hand, Comparison Example 10 exhibited lower DOP on fresh and unacceptably poor DOP with an aged printing plate. This means that some PAA cause slow dissolving speed into a fountain solution, resulting in a slower DOP was seen. Invention Example 3 comprised a mixture of PAA and neutralized PAA in the non crosslinked hydrophilic polymer in the substrate. PAA and neutralized PAA can exchange their cations in the SE02 solution of TABLE II very quickly to obtain a partially neutralized polymer that provides good balance of BG after 2,000 printing impressions property and a desired DOP for aged printing plates.

Comparison Example 16 showed good on-press developability at the beginning of the printing cycle, but the imaged printing layer was destroyed quickly because the hydrophilic layer was too thick.

Positive-Working Lithographic Printing Plate Precursors:

Synthesis of Resin 1:

In a 10 liter flask equipped with a stirrer, a capacitor, and a dropping device, 2,990 g of dimethylacetamide were charged and heated to 90° C. Then, 740.5 g of phenyl maleimide, 1,001 g of methacrylamide, 368 g of methacrylic acid, 643 g of acrylonitrile, 203.6 g of Phosmer M (manufactured by Uni-Chemical Co, Ltd.), 222.5 g of styrene, 10.6 g of AIBN free radical initiator, and 16 g of n-dodecylmercaptan were dissolved in 2,670 g of dimethylacetamide. The resulting solution was added dropwise to a reactor over 2 hours. After completion of the dropwise addition, 5.3 g of AIBN were added to the solution and its temperature was raised to 100° C., followed by stirring for 4 hours. During stirring, the reaction was continued by adding 5.3 g of AIBN every hour. After the completion of the reaction, heating was stopped, and the resulting reaction solution was cooled to room temperature. The reaction solution was poured into 50 liters of water and the resulting precipitate was collected by filtration under reduced pressure, washed once with water, and collected by filtering again under reduced pressure. The precipitate was vacuum-dried at 50° C. for 24 hours to obtain Resin 1 in an amount of 2,873 g (yield of 90%).

Lower Layer Coating Formulation:

A lower layer coating formulation was prepared using the compounds shown in TABLE VIII below.

TABLE VIII

| | Grams |
|---|---|
| Methyl ethyl ketone | 47.28 |
| Propylene glycol monomethyl ether | 28.37 |
| γ-Butyrolactone | 9.46 |
| Water | 9.46 |
| Resin 1 | 3.95 |
| Cyanine IR dye A (see below) | 0.50 |
| Cyanine IR dye B (see below) | 0.40 |
| D11 (see below) | 0.10 |
| Paintad 19 (manufactured by Dow Corning) | 0.05 |

Upper Layer Coating Formulation:

An upper layer coating formulation was prepared using the compounds shown in TABLE IX below.

TABLE IX

| | Grams |
|---|---|
| Methyl isobutyl ketone | 66.32 |
| Acetone | 19.00 |
| Propylene glycol monomethyl ether acetate | 9.50 |
| SMA resin* (average molecular weight: 200) | 4.93 |
| Victoria Pure Blue BOH-M | 0.02 |
| Paintad 19 | 0.05 |

*SMA resin is a copolymer derived from styrene and maleic anhydride (molar ratio of 1:1).

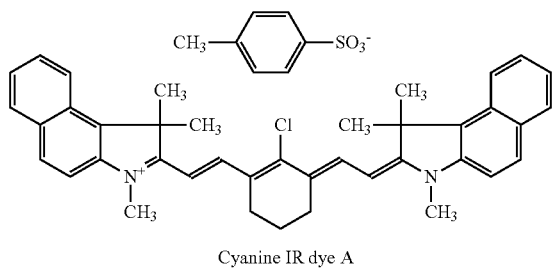

Cyanine IR dye A

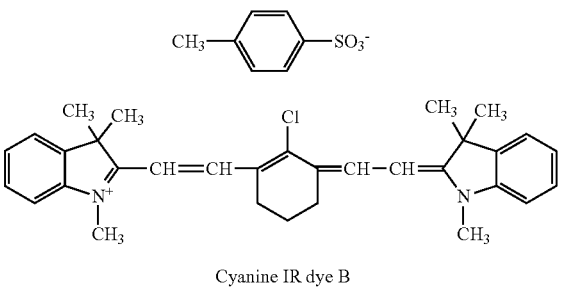

Cyanine IR dye B

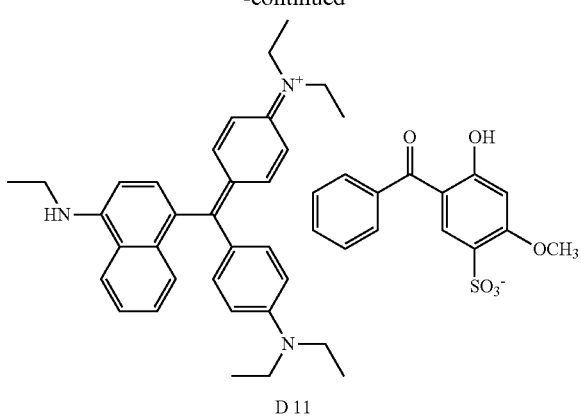

D 11

Preparation of Lithographic Printing Plate Precursor:

The lower layer coating formulation of TABLE VIII was applied to each of the inventive substrates described below in TABLE X using a bar coater and then dried at 100° C. for 2 minutes to provide a dry coating weight of 1.5 g/m². On each dried lower layer, the upper layer coating formulation of TABLE IX was applied using a bar coater and then dried at 100° C. for 2 minutes to provide a dry coating weight of 0.5 g/m².

TABLE X

| | Printing Plate Precursor | Substrates of TABLE VI |
|---|---|---|
| Invention | 12 | B-1 |
| " | 13 | B-6 |
| Comparison | 17 | BC-1 |
| " | 18 | BC-2 |

Preparation of Developing Solution:

A developing solution was prepared using the compounds shown in TABLE XI below to have a pH of 11.5 and conductivity of 1.2 mS/cm.

TABLE XI

| | Grams |
|---|---|
| Deionized water | 700 |
| Monoethanolamine | 10 |
| Diethanolamine | 30 |
| Pellex NBL (manufactured by Kao Corporation) | 200 |
| Benzyl alcohol | 60 |

Preparation of Lithographic Printing Plate:

Each of the two-layered lithographic printing plate precursors obtained as described above was exposed at 150 mJ/cm² using a PTR4300 imagesetter, developed with a developing solution (prepared by diluting the developing solution shown in TABLE XI with water five times) at 30° C. for 15 seconds using an automatic processor (P-940X, manufactured by Eastman Kodak Company), and then finished using finishing gum PF2 (manufactured by Eastman Kodak Company) to obtain lithographic printing plates.

Off-Press Developable Negative-working Lithographic Printing Plate Precursors:

A free radical photosensitive imageable layer coating formulation was prepared using the compounds shown below in TABLE XII.

TABLE XII

| Compound | Grams |
|---|---|
| Propylene glycol methyl ether | 30.664 |
| Methyl ethyl ketone | 59.664 |
| Polymer A | 2.02 |
| Polymer B | 0.132 |
| ACA 230AA | 3.813 |
| IR Dye A | 0.187 |
| DPHA | 2.847 |
| Dye B | 0.264 |
| MDP | 0.075 |
| Initiator A | 0.536 |
| P3B | 0.038 |

Polymer A is a copolymer derived from methacrylic acid, allyl methacrylate, and methyl methacrylate.

Polymer B has the structure described below and was provided as a 25 weight % solution in methyl isobutyl ketone.

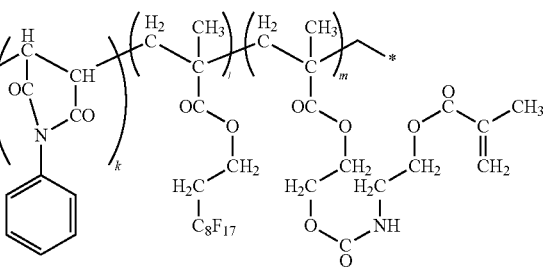

k:l:m = 54:15:31

IR dye A has the following structure:

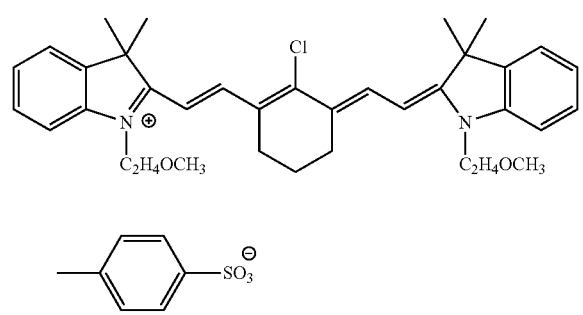

DPHA is di-pentaerythritol hexaacrylate that is available from NIPPON KAYAKU (Tokyo).

Dye B is a triphenylmethane having the following structure:

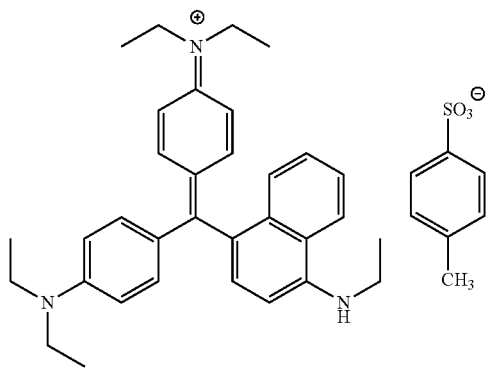

MDP shown below and is available from SUMITOMO Chemical (Tokyo).

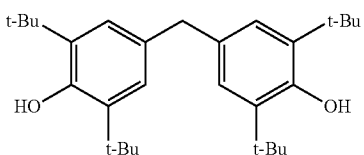 [SMILES: CC(C)(C)c1cc(Cc2cc(C(C)(C)C)c(O)c(C(C)(C)C)c2)cc(C(C)(C)C)c1O]

P3B is described below and is available from SHOWA DENKO (Tokyo).

Borate A has the following structure:

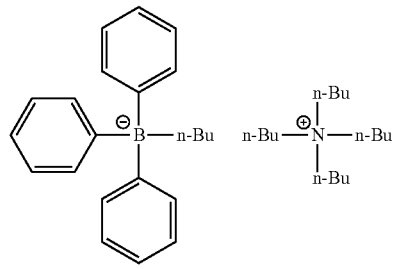

ACA230AA is an alkaline soluble acrylic polymer having ethylenically unsaturated pendant groups (53% solids) that is available from DAICEL chemical (Osaka, Japan).

A protective overcoat coating formulation was prepared using the compounds shown in TABLE XIII below.

TABLE XIII

| Compound | Grams |
|---|---|
| PVA-203 | 1.956 |
| Luvitec ™ K30 | 0.652 |
| Newcol 2305 | 0.086 |
| Newcol 2320 | 0.174 |
| Water | 96.963 |

PVA-203 and Luvitec™ K30 are already described above.

Newcol 2305 is poly(oxyethylene)alkyl ether that was obtained from Nippon Nyukazi (Tokyo, Japan).

Newcol 2320 is poly(oxyethylene)alkyl ether that was obtained from Nippon Nyukazi (Tokyo, Japan).

Preparation of Lithographic Printing Plate Precursor:

The imageable layer coating formulation described above was applied onto each of the inventive substrates described below in TABLE XIV using a bar coater and then dried at 100° C. for 2 minutes to provide a dry coating weight of 1.2 g/m². The protective overcoat coating formulation was applied over each dried imageable layer using a bar coater and then dried at 100° C. for 2 minutes to provide a dry coating weight of 0.5 g/m².

TABLE XIV

| | Printing Plate Precursor | Substrates of TABLE VI |
|---|---|---|
| Invention | 14 | B-1 |
| " | 15 | B-6 |
| Comparison | 19 | BC-1 |
| " | 20 | BC-2 |

Preparation of Lithographic Printing Plate:

Each of the lithographic printing plate precursors described above was exposed at 90 mJ/cm² using a PTR4300 imagesetter, developed using a developer (prepared by diluting TND-1 from Kodak-Japan, Tokyo with water by 3.5 times) at 30° C. for 12 seconds using an automatic processor (PK-1310 news, manufactured by Eastman Kodak Company), and then finished using finishing gum NF-3 (manufactured by Eastman Kodak Company) diluted with water one time to obtain a lithographic printing plate.

Printing Press Test:

In TABLE XV below, "BG" refers to the background scumming at press start (0 impressions) and after 2,000 printed impressions. "LOR" refers to the "press life" of the lithographic printing plate (an indication of durability). "NA" means not applicable or not available. "NG" refers to a "no good" result. The evaluations "A", "B", "C", "D", and "E" represent a range of very good (A) to very poor (E).

The LOR data were obtained using a Sprint-26 printing press (Komori Corporation, Tokyo) at a speed of 9,000 rpm. The fountain solution was a mixture of 10% isopropanol and 1% K-701 (DIC, Tokyo) in water. The printer's blanket was 57400 that is available from Kinyo-sha (Tokyo). OK topcoat paper matte N grade paper (Oji Paper, Tokyo) was used for printed impressions, and the lithographic printing ink was FINE INK KPG Magenta N grade ink (DIC, Tokyo).

The BG data were obtained using a Roland 200 printing press (Man Roland Japan, Saitama Toda, Japan) that was run at 9,000 rpm. The fountain solution was a mixture of 1% isopropanol and 1% NA-108W (DIC, Tokyo) in water. The printer's blanket was 57400 noted above. OK topcoat paper matte N grade paper (noted above) was used for printed impressions, and the lithographic printing ink was Fusion G Magenta N grade ink (DIC, Tokyo).

TABLE XV

| | Printing Plate Precursor | BG (start, 0 impressions) | BG (after 2,000 impressions) | LOR |
|---|---|---|---|---|
| Invention | 12 | OK | OK | A |
| " | 13 | OK | OK | B |
| " | 14 | OK | OK | A |
| " | 15 | OK | OK | B |
| Comparison | 17 | NG | NG | NA |
| " | 18 | OK | NG | C |
| " | 19 | NG | NG | NA |
| " | 20 | OK | NG | D |

Both the off-press developable negative-working lithographic printing plate precursors and the positive-working lithographic printing plate precursors described above that were prepared using eight the B-1 or B-6 substrate needed developing process showed excellent LOR without any background scumming(BG) during the start of printing and after 2,000 impressions. On the other hand, the lithographic printing plate precursors prepared using the BC-1 substrate showed severe background scumming because of the lack of the hydrophilic layer, and they could not be evaluated. The lithographic printing plate prepared using the BC-2 substrate also showed poorer background scumming after 2,000 impressions and poorer LOR due to its cross-linked polymer that had no carboxylic acid side chains.

The invention has been described in detail with particular reference to certain preferred embodiments thereof, but it will be understood that variations and modifications can be effected within the spirit and scope of the invention.

The invention claimed is:

1. A lithographic printing plate precursor comprising a substrate and at least one radiation-sensitive imageable layer disposed over the substrate, the radiation-sensitive imageable layer comprising a radiation absorber,
the substrate comprising a grained and sulfuric acid anodized aluminum-containing support, which support has also been treated with an alkaline or acidic pore-widening solution to provide its outer surface with columnar pores so that the average diameter of the columnar pores at their outermost surface is at least 90% of the average diameter of the columnar pores and is at least 20 nm and up to and including 40 nm,
the substrate further comprising a hydrophilic layer that is directly disposed on and that is at least partially within the columnar pores on the grained, sulfuric acid anodized and treated aluminum-containing support, the hydrophilic layer comprising a non-crosslinked hydrophilic polymer having carboxylic acid side chains,
wherein the substrate does not comprise post-treatment coatings of poly(vinyl phosphonic acid), vinyl phosphonic acid copolymers, silicates, dextrin, calcium zirconium fluoride, hexafluorosilicate, or a phosphate solution containing an inorganic fluoride.

2. The precursor of claim 1 wherein the non-crosslinked hydrophilic polymer is present at a dry coverage of at least 0.001 $g/m^2$ and up to and including 0.4 $g/m^2$.

3. The precursor of claim 1 that is a negative-working lithographic printing plate precursor having a negative-working radiation-sensitive imageable layer comprising a free radically polymerizable compound, the radiation absorber, and a compound to generate free radicals upon irradiation.

4. The precursor of claim 1 that is a negative-working lithographic printing plate precursor having a negative-working, infrared radiation-sensitive imageable layer comprising a free radically polymerizable compound, an infrared radiation absorber, and a compound to generate free radicals upon irradiation.

5. The precursor of claim 1 wherein the non-crosslinked hydrophilic polymer has carboxylic acid side chains that are neutralized to a degree of at least 1 mol % and up to and including 60 mol %.

6. The precursor of claim 1 wherein the non-crosslinked hydrophilic polymer is present at a dry coverage of at least 0.01 $g/m^2$ and up to and including 0.3 $g/m^2$.

7. The precursor of claim 1 wherein the grained and sulfuric acid anodized and treated aluminum-containing support has been electrochemically grained.

8. The precursor of claim 1 wherein the hydrophilic layer is a non-radiation-sensitive hydrophilic layer.

9. A method of preparing a lithographic printing plate comprising:
imagewise exposing the lithographic printing plate precursor of claim 1 to provide an exposed precursor having exposed and non-exposed regions in the radiation-sensitive imageable layer, and
processing the exposed precursor to remove either the non-exposed regions or the exposed regions to provide a lithographic printing plate.

10. The method of claim 9 wherein the processing further removes the hydrophilic layer that is disposed directly on the substrate and under the radiation-sensitive imageable layer, in either the non-exposed regions or the exposed regions that are removed.

11. The method of claim 9 wherein the lithographic printing plate precursor is a negative-working lithographic printing plate precursor, and processing of the exposed precursor is carried out off press using water or an alkaline processing solution to remove the non-exposed regions to provide a lithographic printing plate.

12. A method of preparing a lithographic printing plate comprising:
imagewise exposing the lithographic printing plate precursor of claim 1 that is a positive-working lithographic printing plate precursor, to provide an exposed precursor having exposed and non-exposed regions in the radiation-sensitive imageable layer, and
processing the exposed precursor off-press using an alkaline processing solution to remove the exposed regions to provide a lithographic printing plate.

13. A lithographic printing plate precursor comprising a substrate and at least one radiation-sensitive imageable layer disposed over the substrate, the radiation-sensitive imageable layer comprising a radiation absorber,
the substrate comprising a grained and sulfuric acid anodized aluminum-containing support, which support has also been treated with an alkaline or acidic pore-widening solution to provide its outer surface with columnar pores so that the average diameter of the columnar pores at their outermost surface is at least 90% of the average diameter of the columnar pores and is at least 20 nm and up to and including 40 nm,
the substrate further comprising a hydrophilic layer that is disposed directly on and that is at least partially within the columnar pores on the grained, sulfuric acid anodized and treated aluminum-containing support, the hydrophilic layer comprising a non-crosslinked hydrophilic polymer having carboxylic acid side chains, and an inorganic phosphoric acid or a precursor of an inorganic phosphoric acid,
wherein the substrate does not comprise post-treatment coatings of polyvinyl phosphonic acid), vinyl phosphonic acid copolymers, silicates, dextrin, calcium zirconium fluoride, hexafluorosilicate, or a phosphate solution containing an inorganic fluoride.

* * * * *